United States Patent
Little et al.

(10) Patent No.: US 9,997,853 B2
(45) Date of Patent: Jun. 12, 2018

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Chao-Chieh Chen, New Taipei (TW); Chun-Chieh Yang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days. days.

(21) Appl. No.: 15/496,002

(22) Filed: Apr. 25, 2017

(65) Prior Publication Data
US 2017/0229799 A1    Aug. 10, 2017

Related U.S. Application Data

(63) Continuation of application No. 15/298,185, filed on Oct. 19, 2016, now abandoned, which is a
(Continued)

(51) Int. Cl.
*H01R 24/00* (2011.01)
*H01R 12/72* (2011.01)
(Continued)

(52) U.S. Cl.
CPC ....... *H01R 12/727* (2013.01); *H01R 12/7005* (2013.01); *H01R 12/75* (2013.01); *H01R 13/64* (2013.01); *H01R 13/6585* (2013.01)

(58) Field of Classification Search
CPC ............ H01R 23/6873; H01R 23/7073; H01R 23/7063; H01R 23/725; H01R 23/688; H01R 13/65802; H01R 13/658
(Continued)

(56) References Cited

U.S. PATENT DOCUMENTS 5,073,130 A    12/1991    Nakamura
6,755,689 B2    1/2004    Zhang et al.
(Continued)

FOREIGN PATENT DOCUMENTS

CN    1253402 A    5/2000
CN    2454802 Y    10/2001
(Continued)

OTHER PUBLICATIONS

Universal Serial Bus Type-C Cable and Connector Specification Revision 0.7 Working Draft Jan. xx, 2014, pp. 13-14,20-21,33,38.
(Continued)

*Primary Examiner* — Hien Vu
(74) *Attorney, Agent, or Firm* — Wei Te Chung; Ming Chieh Chang

(57) ABSTRACT

A receptacle connector includes an insulative housing defining a base and a mating tongue extending from the base, the mating tongue defining a thicken step structure around a root thereof adjacent to the base; two rows of contacts disposed in the insulating housing with contacting sections exposed upon the mating tongue and mount tails out of the base; and a shielding plate embedded within the insulative housing and disposed between the two rows of contacts. The shielding plate defines a pair of locking sides for locking with an internal latch of a corresponding plug and the locking sides protruding beyond corresponding lateral sides of the mating tongue. The insulative housing and the shielding plate are integrally formed via an insert molding process while at least one row of the contacts are configured to be forwardly assembled to corresponding passageways in the insulating housing.

10 Claims, 44 Drawing Sheets

Related U.S. Application Data continuation-in-part of application No. 14/695,065, filed on Apr. 24, 2015, now Pat. No. 9,496,653, and a continuation-in-part of application No. 14/688,993, filed on Apr. 16, 2015, now Pat. No. 9,496,664, and a continuation-in-part of application No. 14/558,732, filed on Dec. 3, 2014, now Pat. No. 9,490,594, application No. 15/496,002, which is a continuation-in-part of application No. 15/346,642, filed on Nov. 8, 2016, which is a continuation-in-part of application No. 14/839,880, filed on Aug. 28, 2015, now Pat. No. 9,490,579, which is a continuation-in-part of application No. 14/688,993, filed on Apr. 16, 2015, now Pat. No. 9,496,664, and a continuation-in-part of application No. 14/558,732, filed on Dec. 3, 2014, now Pat. No. 9,490,594, and a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, and a continuation-in-part of application No. 14/477,889, filed on Sep. 5, 2014, now Pat. No. 9,525,223, and a continuation-in-part of application No. 14/454,737, filed on Aug. 8, 2014, now Pat. No. 9,525,227, and a continuation-in-part of application No. 14/337,180, filed on Jul. 21, 2014, now Pat. No. 9,318,853, and a continuation-in-part of application No. 14/571,941, filed on Oct. 20, 2014, now Pat. No. 9,496,662.

(60) Provisional application No. 62/002,934, filed on May 26, 2014, provisional application No. 62/021,066, filed on Jul. 4, 2014, provisional application No. 62/026,046, filed on Jul. 18, 2014, provisional application No. 62/035,472, filed on Aug. 10, 2014, provisional application No. 61/981,217, filed on Apr. 18, 2014, provisional application No. 61/989,508, filed on May 6, 2014, provisional application No. 62/001,084, filed on May 21, 2014, provisional application No. 62/044,195, filed on Aug. 30, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 12/70* (2011.01)
*H01R 12/75* (2011.01)
*H01R 13/6585* (2011.01)
*H01R 13/64* (2006.01)

(58) Field of Classification Search
USPC .............. 439/660, 79, 607.35, 108
See application file for complete search history.

(56) References Cited

U.S. PATENT DOCUMENTS

| | | | |
|---|---|---|---|
| 7,758,379 | B2 | 7/2010 | Chen |
| 8,087,944 | B2 | 1/2012 | Kumamoto et al. |
| 8,517,773 | B2 | 8/2013 | Lee et al. |
| 8,968,031 | B2 | 3/2015 | Simmel |
| 9,281,642 | B1 | 3/2016 | Tseng et al. |
| 9,300,095 | B2 | 3/2016 | Lin et al. |
| 9,312,641 | B2 | 4/2016 | Wang et al. |
| 9,318,856 | B2 * | 4/2016 | MacDougall ...... H01R 13/6581 |
| 9,379,499 | B2 * | 6/2016 | Miyoshi ................ H01R 24/60 |
| 2007/0049100 | A1 | 3/2007 | Tsai |
| 2008/0003881 | A1 | 1/2008 | Wu |
| 2009/0156027 | A1 | 6/2009 | Chen |
| 2010/0267261 | A1 | 10/2010 | Lin et al. |
| 2013/0095702 | A1 | 4/2013 | Golko et al. |
| 2014/0024257 | A1 * | 1/2014 | Castillo .............. H01R 13/6585 439/607.05 |
| 2015/0162684 | A1 | 6/2015 | Amini et al. |
| 2015/0171562 | A1 | 6/2015 | Gao et al. |
| 2015/0214673 | A1 | 7/2015 | Gao et al. |
| 2015/0214674 | A1 | 7/2015 | Simmel et al. |
| 2015/0295362 | A1 | 10/2015 | Tziviskos et al. |
| 2015/0340813 | A1 | 11/2015 | Ng et al. |
| 2015/0340815 | A1 | 11/2015 | Gao et al. |
| 2015/0340825 | A1 | 11/2015 | Ng et al. |
| 2016/0118752 | A1 | 4/2016 | Guo et al. |

FOREIGN PATENT DOCUMENTS

| | | |
|---|---|---|
| CN | 2724249 Y | 9/2005 |
| CN | 2728006 Y | 9/2005 |
| CN | 2821921 Y | 9/2006 |
| CN | 201029143 Y | 2/2008 |
| CN | 201078847 Y | 6/2008 |
| CN | 201107821 Y | 8/2008 |
| CN | 201230066 Y | 4/2009 |
| CN | 101573840 A | 11/2009 |
| CN | 201498627 U | 6/2010 |
| CN | 201623280 | 11/2010 |
| CN | 201708399 U | 1/2011 |
| CN | 201717435 U | 1/2011 |
| CN | 201741935 U | 2/2011 |
| CN | 201741937 U | 2/2011 |
| CN | 201868687 U | 6/2011 |
| CN | 102280732 B | 12/2011 |
| CN | 202076514 U | 12/2011 |
| CN | 102437482 A | 5/2012 |
| CN | 103107439 A | 5/2012 |
| CN | 202217831 U | 5/2012 |
| CN | 102544812 A | 7/2012 |
| CN | 202423735 | 9/2012 |
| CN | 202513384 U | 10/2012 |
| CN | 202737282 | 2/2013 |
| CN | 103081253 A | 5/2013 |
| CN | 203242848 U | 10/2013 |
| CN | 103401087 A | 11/2013 |
| CN | 103427263 A | 12/2013 |
| CN | 203326282 U | 12/2013 |
| CN | 103647172 A | 3/2014 |
| CN | 203481540 U | 3/2014 |
| CN | 103762479 A | 4/2014 |
| CN | 203521683 | 4/2014 |
| CN | 203521683 U | 4/2014 |
| CN | 104377509 A | 2/2015 |
| CN | 204243365 U | 4/2015 |
| CN | 204577669 U | 8/2015 |
| TW | 371520 | 10/1999 |
| TW | 452247 | 8/2001 |
| TW | M266600 | 6/2005 |
| TW | M288035 | 2/2006 |
| TW | M299952 | 10/2006 |
| TW | M357077 | 5/2009 |
| TW | M386661 | 8/2010 |
| TW | M391213 | 10/2010 |
| TW | M398256 | 2/2011 |

(56) References Cited

FOREIGN PATENT DOCUMENTS

| TW | M398262 | 2/2011 |
|---|---|---|
| TW | M426911 | 4/2011 |
| TW | I427870 | 6/2011 |
| TW | M414692 | 10/2011 |
| TW | M443957 | 12/2012 |
| TW | M453995 | 5/2013 |
| TW | M454654 | 6/2013 |
| TW | 201328064 A | 7/2013 |
| TW | M471688 | 2/2014 |
| TW | M475728 | 4/2014 |
| WO | WO2009147791 | 12/2009 |
| WO | WO2013/020359 | 2/2013 |

OTHER PUBLICATIONS

USB Type-C Specification 0.9c05-20140518, pp. 24-44,47,53-64,84-86.
Universal Serial Bus Type-C Cable and Connector Specification Revision 1.0 Aug. 11, 2014, pp. 18-19,28-48,51,55,58,59-63,65-67,70,93,96-99.107,110-113.

* cited by examiner

FLIPPABLE ELECTRICAL CONNECTOR

CROSS REFERENCE TO RELATED APPLICATIONS

This application is a continuation of the co-pending application Ser. No. 15/346,642 filed on Nov. 8, 2016 and Ser. No. 15/298,185 filed on Oct. 19, 2016, and, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals.

Hence, a new and simple electrical plug connector and the complementary receptacle connector are desired.

SUMMARY OF THE INVENTION

Accordingly, the object of the present invention is to provide a receptacle connector comprises an insulative housing defining a base and a mating tongue extending from the base, the mating tongue defining a thicken step structure around a root thereof adjacent to the base; two rows of contacts disposed in the insulating housing with contacting sections exposed upon the mating tongue and mount tails out of the base; and a shielding plate embedded within the insulative housing and disposed between the two rows of contacts. The shielding plate defines a pair of locking sides for locking with an internal latch of a corresponding plug and the locking sides protruding beyond corresponding lateral sides of the mating tongue. The insulative housing and the shielding plate are integrally formed via an insert molding process while at least one row of the contacts are configured to be forwardly assembled to corresponding passageways in the insulating housing.

Other objects, advantages and novel features of the invention will become more apparent from the following detailed description when taken in conjunction with the accompanying drawings.

DETAILED DESCRIPTION OF THE PREFERRED EMBODIMENT

Figure 1:
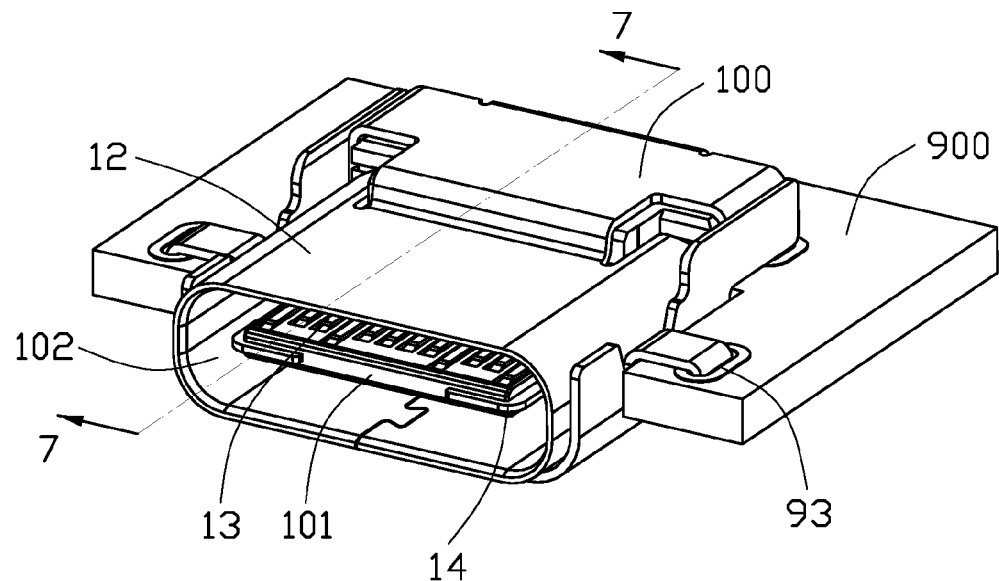
FIG. 1 is a perspective view of a receptacle connector of a first embodiment of the instant invention, which is mounted upon a printed circuit board (PCB) in a sink manner.
Figure 2:
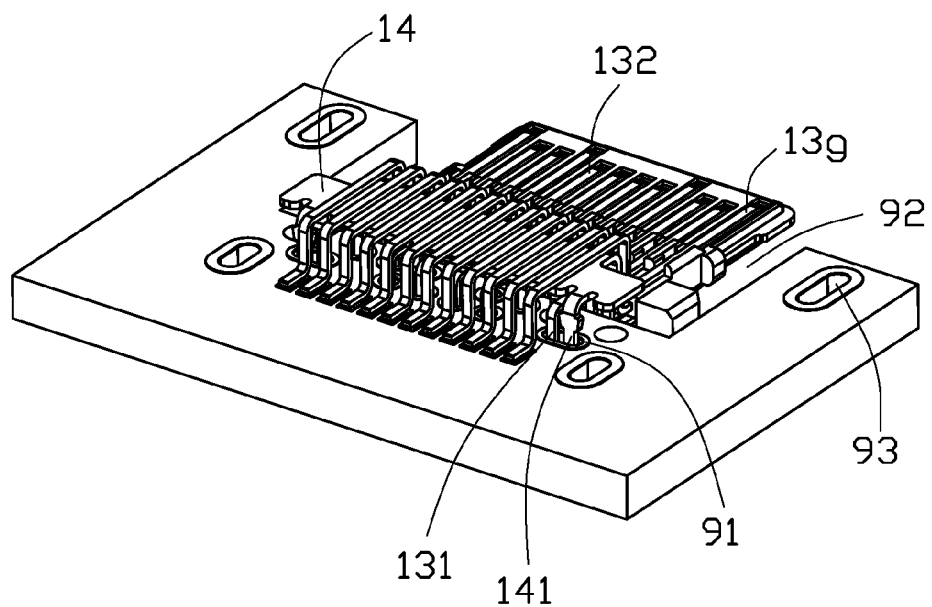
FIG. 2 is a perspective view of the partial receptacle connector and the PCB.
Figure 3:
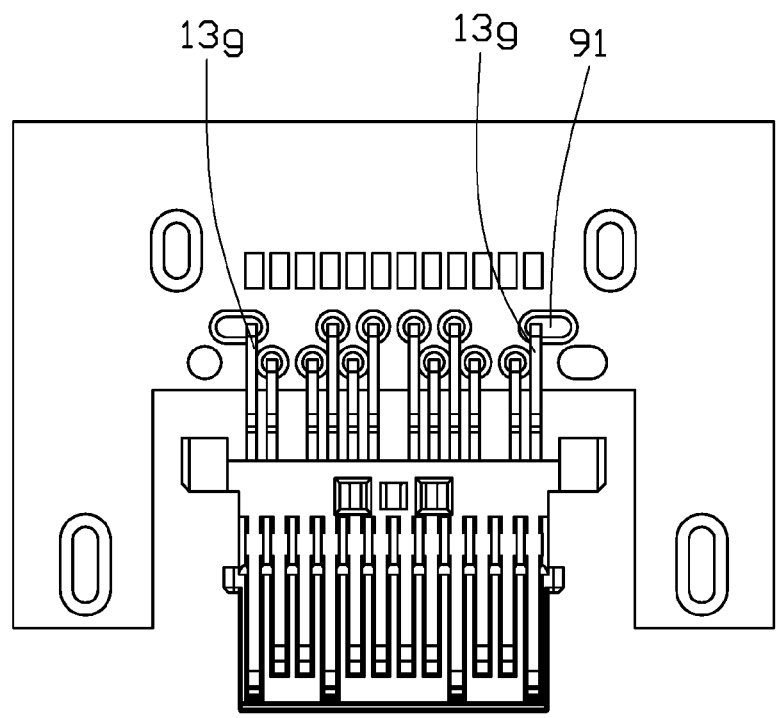
FIG. 3 is a top view of the partial receptacle connector and the PCB of FIG. 2 wherein upper contacts and the shielding plate are taken away.
Figure 4:
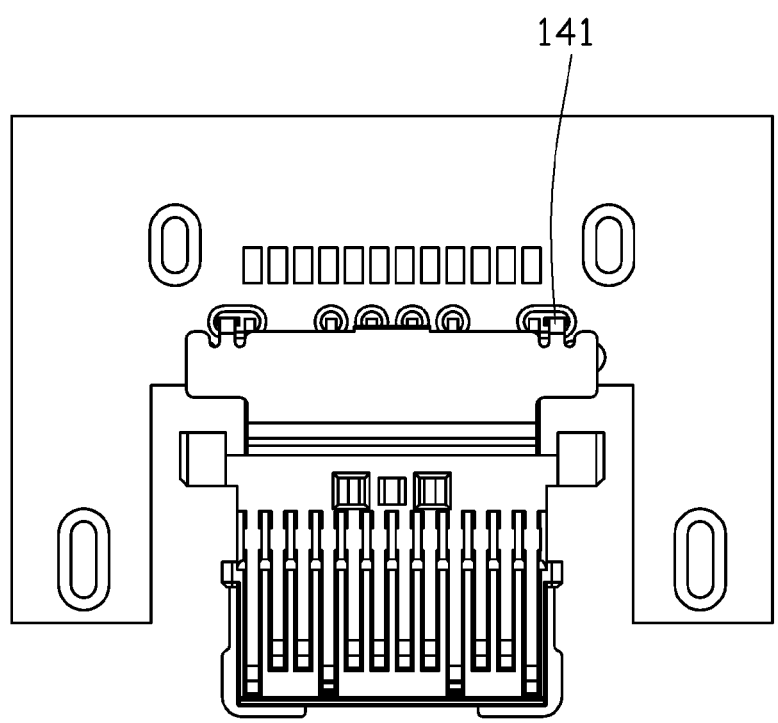
FIG. 4 is a top view of the partial receptacle connector and the PCB of FIG. 2 wherein the upper contacts are taken away.

Reference will now be made in detail to the preferred embodiment of the present invention.

FIGS. 1-12 show a first embodiment of a receptacle connector 100 mounted upon a printed circuit board 900 in a sink manner and a plug connector 200. As shown in FIGS. 1-7, the receptacle connector 100 includes an insulative housing with a mating tongue 101 enclosed in a metallic shell or EMI bracelet 12. A plurality of contacts 13 are disposed in the housing with contacting sections 132 exposed upon two opposite surfaces of the mating tongue 101. Understandably, the contacts 13 include the signal contacts, the grounding contacts and the power contacts thereof. A metallic shielding plate 14 is located at a middle level within the mating tongue 101 with edge portions extending out of the edges of the mating tongue for protection and locking consideration. The leg 141 of the shielding plate 14 and the tail 131 of the outmost grounding contact 13g extend into a same oval shaped via 91 of the printed circuit board 900. This common termination arrangement may achieve good signal transmission performance. Understandably, because the receptacle connector 100 is mounted in a notch 92 of the printed circuit board 900 in a sink manner in this embodiment, the tails 131 of the contacts 13 and the shielding plate 14 form the U-shaped structure for compliantly mounted to the printed circuit board 900.

Figure 5:
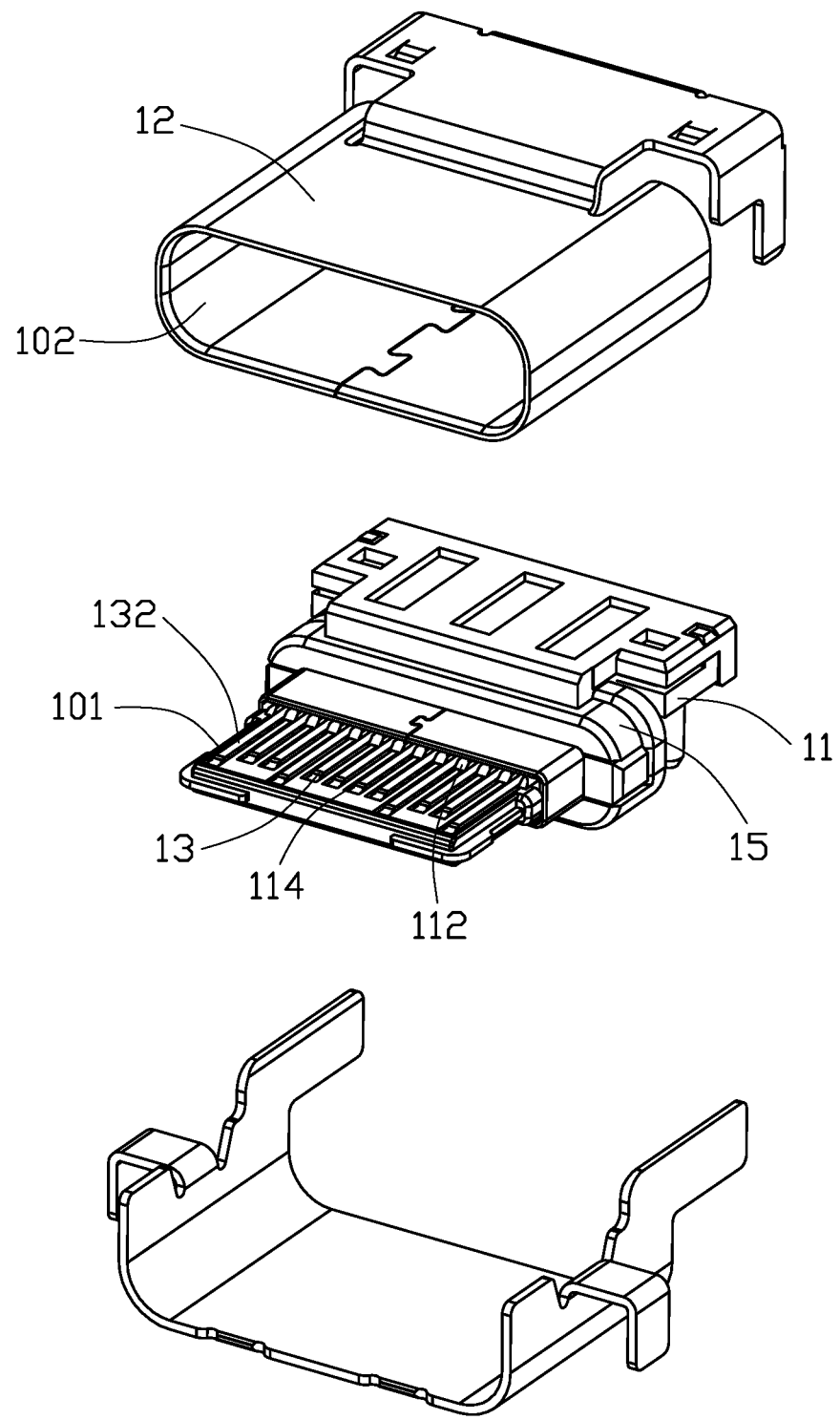
FIG. 5 is a front and toppartially exploded perspective view of the receptacle connector of FIG. 1.
Figure 6:
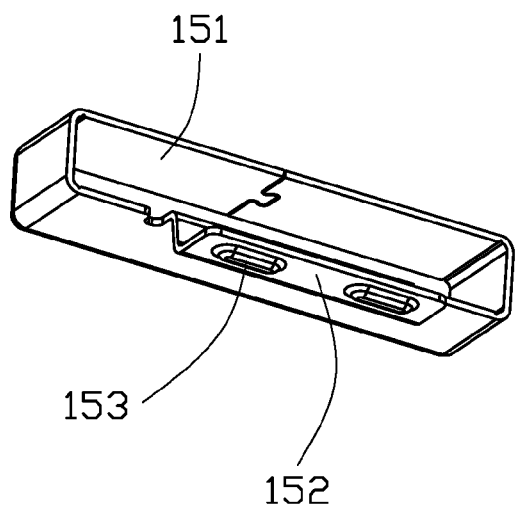
FIG. 6 is an enlarged perspective view of the metallic EMI collar of the receptacle connector.
Figure 7:
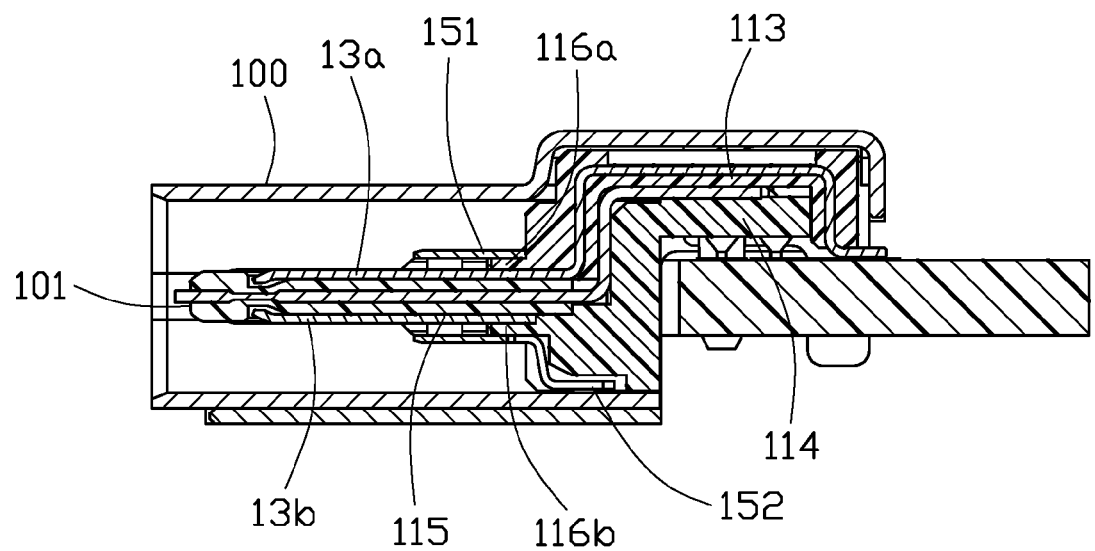
FIG. 7 is a cross-sectional view of the receptacle connector taken along lines 7-7 in FIG. 1.
Figure 8:
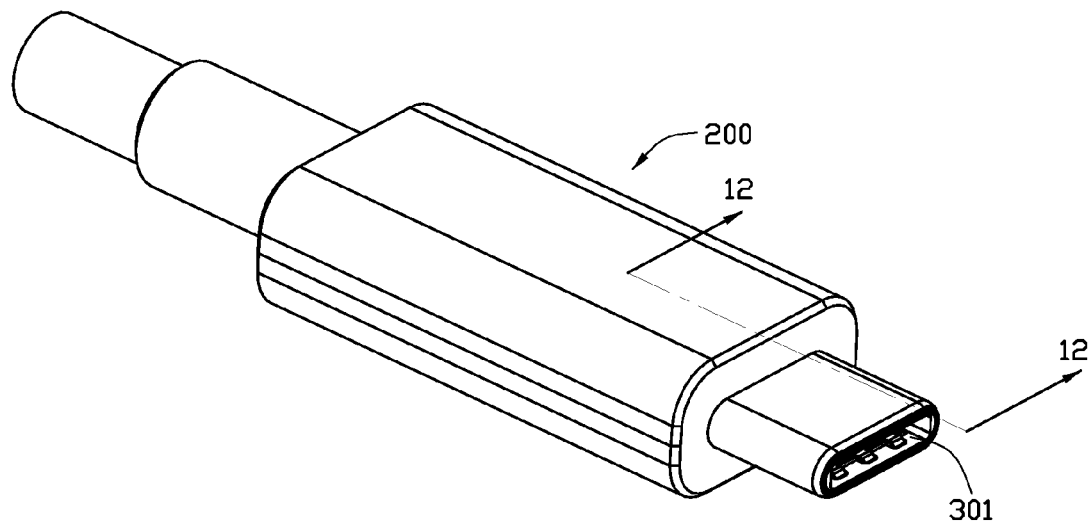
FIG. 8 is a perspective view of a plug connector of the first embodiment of the instant invention.
Figure 9:
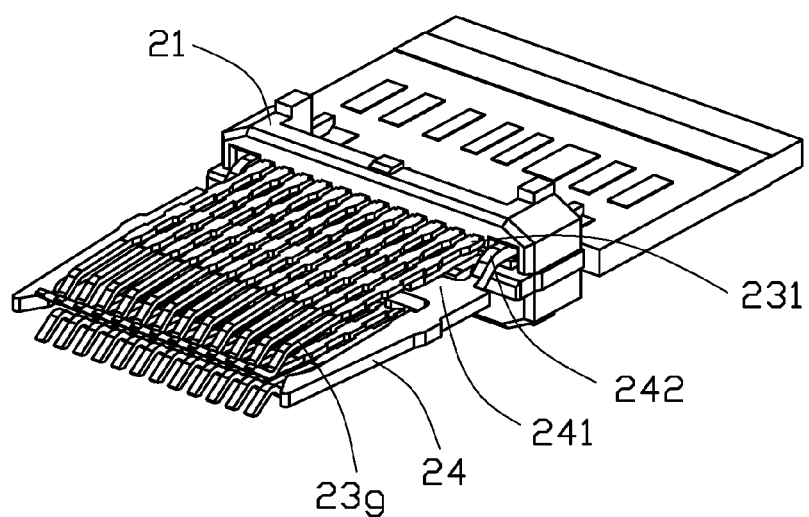
FIG. 9 is an enlarged perspective views of the partial plug connector of FIG. 8 to show the leg of the latch and the tail of the grounding contact share the same grounding pad on the paddle card.
Figure 10:
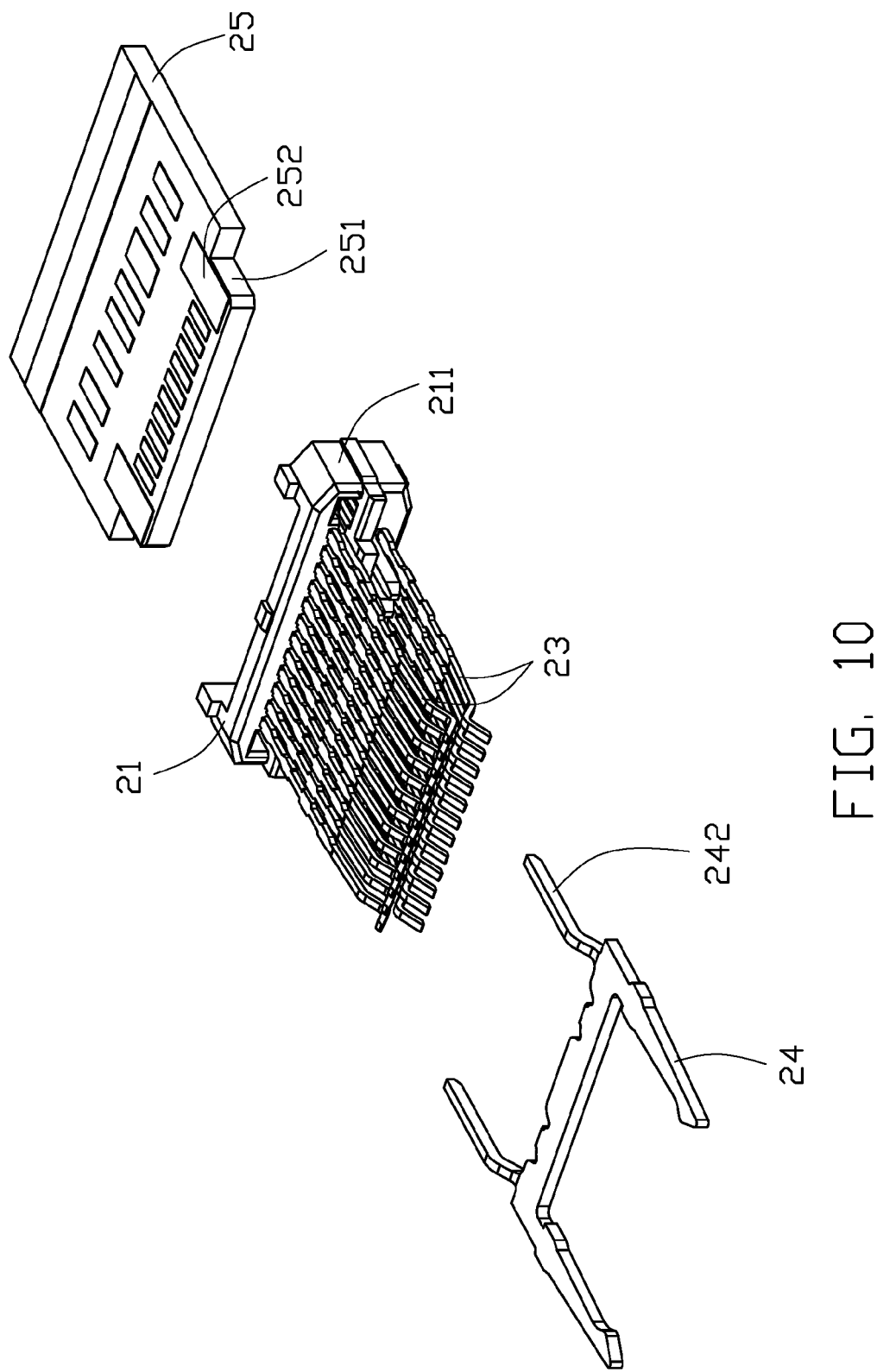
FIG. 10 is an exploded perspective views of the partial plug connector of FIG. 9.
Figure 12:
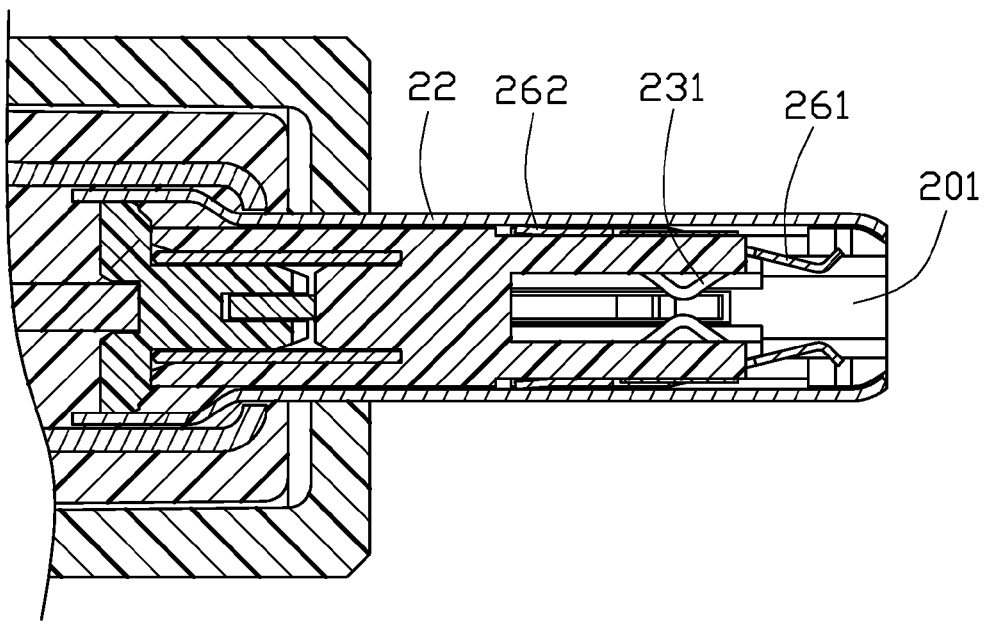
FIG. 12 is an enlarged cross-sectional view of the plug connector taken along lines 12-12 in FIG. 8.
Figure 13:
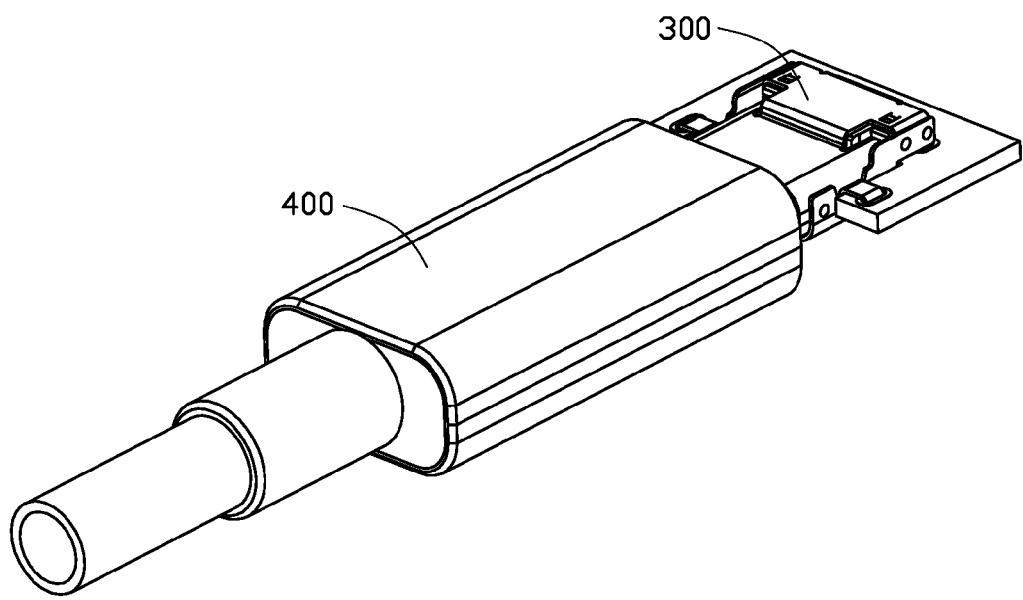
FIG. 13 is an assembled perspective view of a mated receptacle connector on the PCB and a plug connector of a second embodiment of the instant invention.
Figure 14:
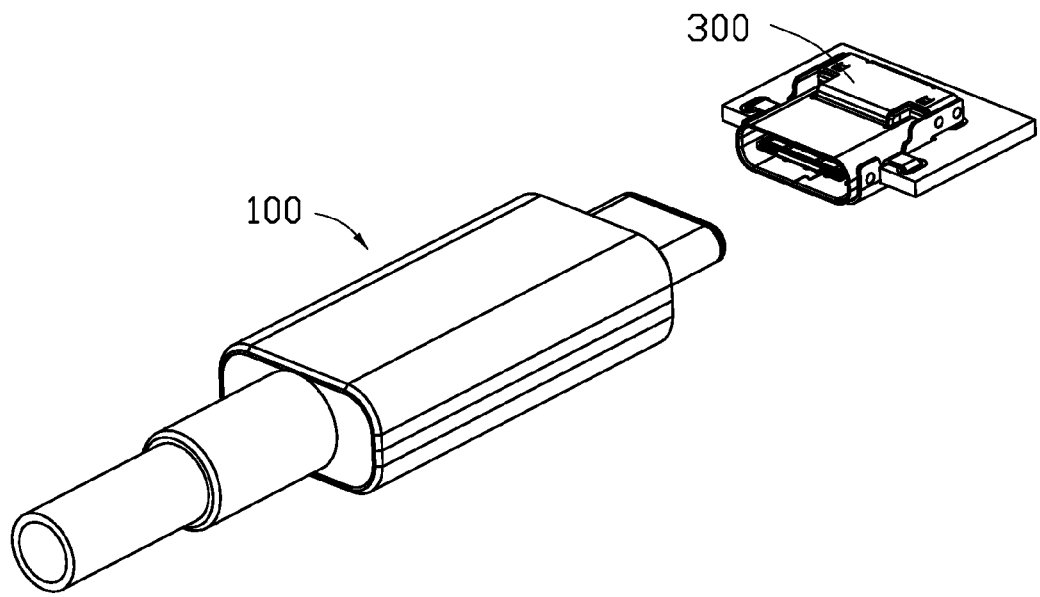
FIG. 14 is a front exploded perspective view of the receptacle connector and the plug connector of FIG. 13.
Figure 15:
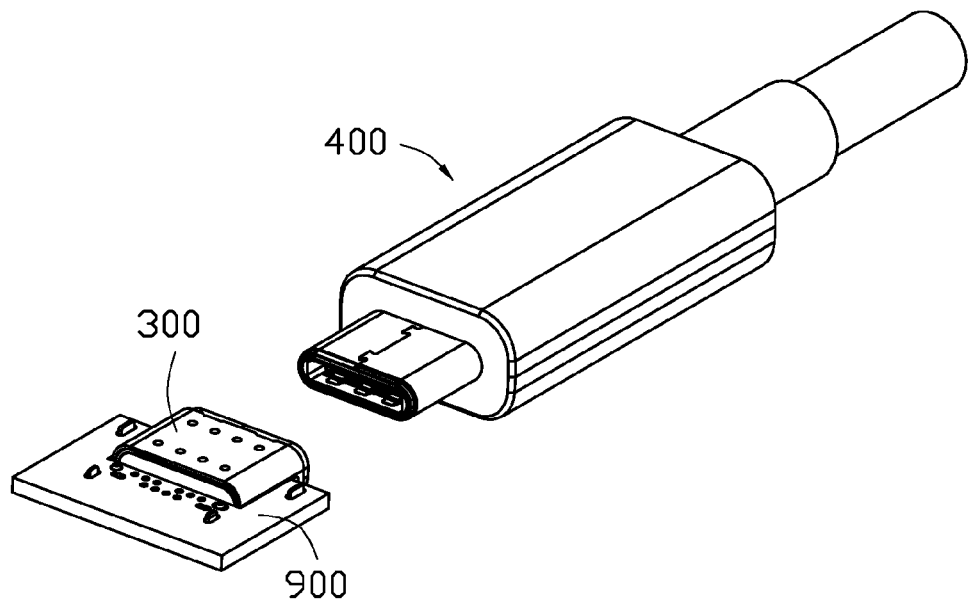
FIG. 15 is a rear exploded perspective view of the receptacle connector and the plug connector of FIG. 13.

As referring to FIGS. 5-7, the receptacle connector 100 includes the insulative housing 11 with the mating tongue 101 forwardly extending in a capsular mating cavity 102 of the metallic shell 12 which encloses the housing 11. Opposite upper and lower rows of contacts 13 are disposed in the housing 11 with corresponding contacting sections 132 seated upon opposite surfaces of the mating tongue 101. A step structure 112 is formed around a root of the mating tongue 101. A one piece metallic EMI collar 15 includes a loop structure 151 intimately surrounding the step structure 112 so as to have a front resilient region 261 of the EMI plate 26 abut thereagainst during mating as best shown in FIG. 12, and a plate structure 152 unitarily extending rearwardly from a rear edge of the loop structure 151 with compression feature 153 thereon to contact the metallic shell 12 (as best shown in FIG. 7). It is noted that because the passageway 114 receiving the corresponding contact 13 is communicative with an exterior in the vertical direction, the corresponding contact 13 may be assembled thereinto in the vertical direction instead of forwardly in a front-to-back direction.

The metallic shell 12 of the receptacle connector 100 includes a top/inner part and a bottom/outer part wherein the top/inner part forms the capsular mating cavity 102 while the bottom/outer part forms the corresponding mounting legs mounted with the corresponding mounting holes 93 (labeled in FIG. 1) in the printed circuit board 900.

As shown in FIG. 7, the insulative housing 11 of receptacle connector 100 is composed of the upper piece 113 and a lower piece 114 commonly sandwiching therebetween a middle piece 115 which forms the mating tongue 101. The upper row contacts 13a are associated with the upper piece 113, the lower row contacts 13b with a lower piece 114 and the shielding plate 14 is associated with the middle piece 115. The feature of this embodiment includes a rear portion of the step structure 112 is removed to have a front edge region 116a of the upper piece 114 and the front edge region 116b of the lower piece 114 sandwiched between the middle piece 115 and the loop structure 151 of the EMI collar 15 so as to enhance the strength during mating under some bending.

FIGS. 8-12 show the plug connector 200 which is adapted for mating with the receptacle connector 100 of the first embodiment, which defines a front mating cavity 301 to receiving the mating tongue 101 of the receptacle connector 100. The plug connector 200 includes an insulative housing 21 having a base 211 defining rear receiving cavity (not shown) to receive a front edge region 251 of the paddle card 25, and the front mating cavity 201 to receive the mating tongue 101 of the receptacle connector 100. Two rows of contacts 23 are disposed in the housing by two sides of the mating cavity 201 in the vertical direction and are categorized with signal contacts, grounding contacts and power contacts. A pair of latches 24 are disposed in the housing by two opposite transverse ends of the mating cavity 201 wherein the rear leg 242 of the latch 24 and the tail 231 of the outmost grounding contact 23g are commonly mounted upon the same grounding pad 252 of the paddle card 25 for optimal transmission performance. The pair of latches 24 is transversely jointed together by a transverse bridge 241 which is located between the two rows of contacts 23.

Figure 11:
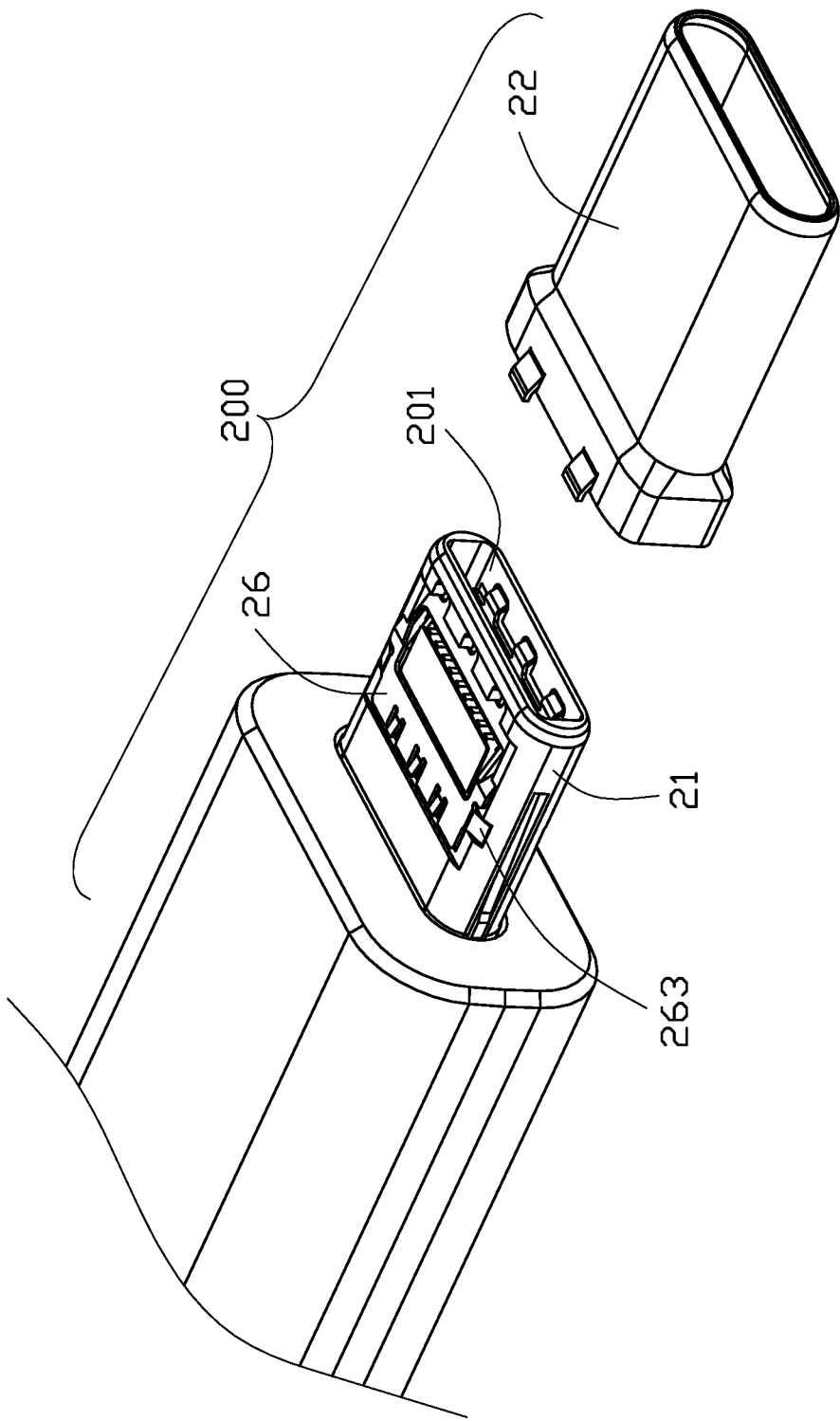
FIG. 11 is an enlarged exploded perspective view of the plug connector of FIG. 8.

As shown in FIGS. 11-12, the insulative housing 21 of the plug connector 200 has a capsular front contour with the rectangular receiving cavity 201 therein and enclosed in a metallic shell 22. Opposite upper and lower rows of contacts 23 are disposed in the housing with corresponding contacting sections 231 extending into the receiving cavity 201. A pair of upper and lower EMI (Electro-Magnetic Interference) plates 26 are enclosed in the shell 22, and each of the EMI plates 26 is sandwiched between the shell 22 and the housing 21 and includes a front resilient region 261 extending inwardly toward the receiving cavity 201 and in front of the contacting sections 231, a rear abutting region 262 to abut against the shell 22, and a pair of side retention regions 263 retainably engaged within corresponding side portions of the housing 21. The shell 22 of the plug connector includes a pair of bent tags (not shown) mechanically and electrically connected to the corresponding grounding pads of the paddle card 25 for EMI.

FIGS. 13-27 show a second embodiment of a plug connector 400 mated with a receptacle connector 300 mounted in the notch 92 of the printed circuit board 900, which is similar to the first embodiment as shown in FIGS. 1-12 with some different which will be described hereinafter.

Figure 16:
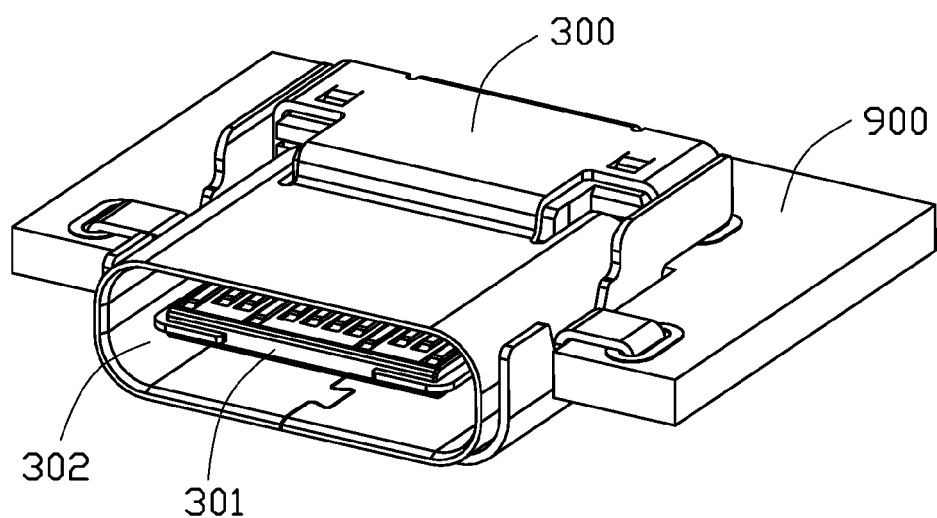
FIG. 16 is a front perspective view of the receptacle connector on the printed circuit board of FIG. 14.
Figure 17:
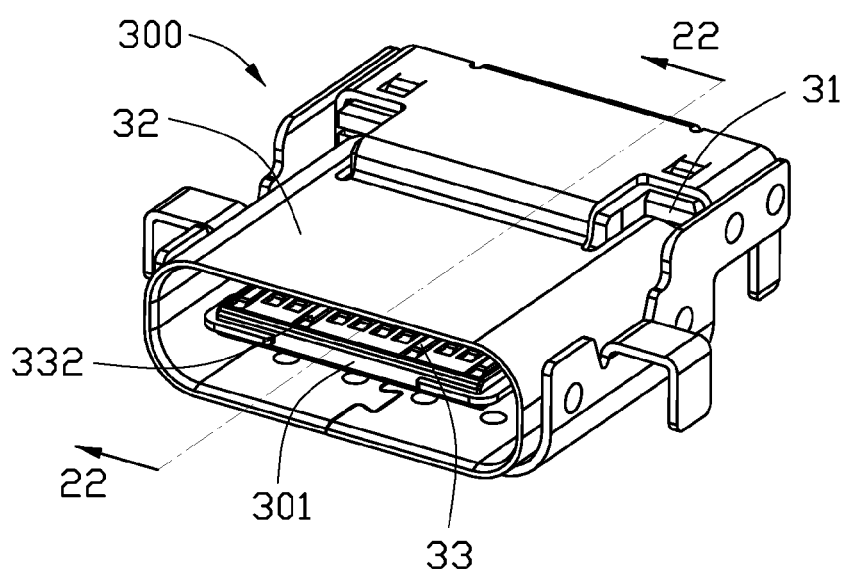
FIG. 17 is a front perspective view of the receptacle connector spaced from the printed circuit board of FIG. 16.
Figure 17:
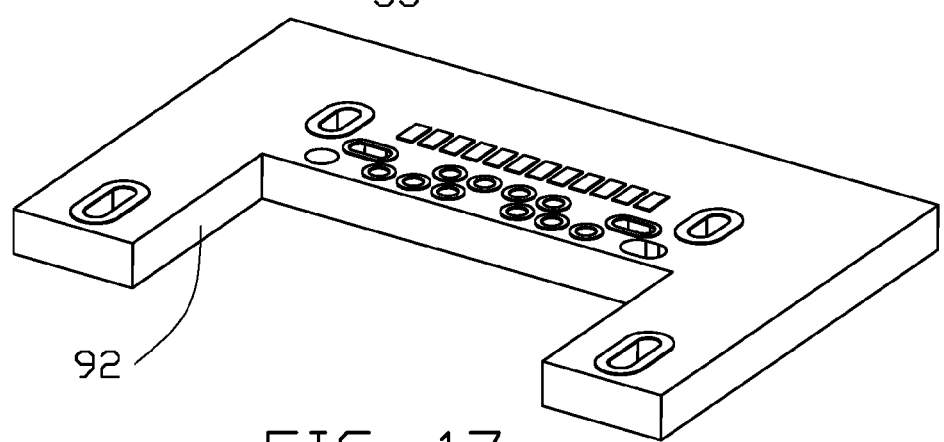

Referring to FIGS. 16-17, the receptacle connector 300 includes an insulative housing/contact seat 31 with a mating tongue 301 forwardly extending in a capsular mating cavity 302 of a metallic shell 32 which encloses the housing 31. Opposite upper and lower rows of contacts 33 are disposed in the housing 31 with corresponding contacting sections 332 exposed upon opposite surfaces of the mating tongue 301 in a diagonally symmetrical arrangement mechanically and electrically so as to allow a so-called flappable insertion of the plug connector 400 thereinto. Combination with FIG. 19, a step structure 311 is formed around a root of the mating tongue 301. A one piece metallic EMI collar 35 includes a loop structure 351 intimately surrounding the step structure 311.

Figure 18:
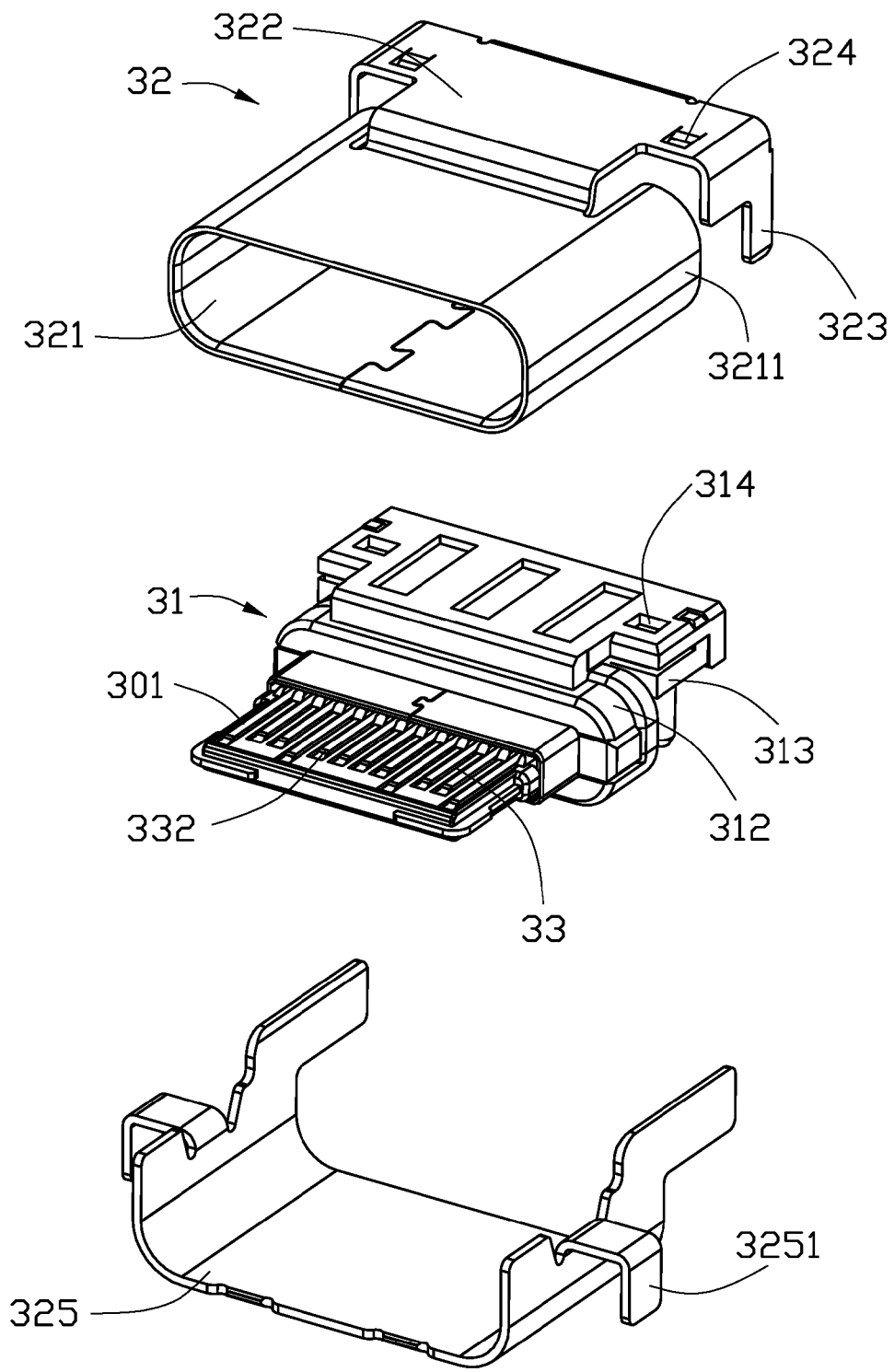
FIG. 18 is a front partially exploded perspective view of the receptacle connector of FIG. 16.

Referring to FIG. 18, the insulating housing 31 further includes a retaining base 312 of a capsular shape, the mating tongue 301 extending forward from the retaining base 312 and a rear mounting portion 313 extending rearward from a top edge of the retaining base 312. The step structure 311 is disposed at a joint of the mating tongue and the retaining base. The metallic shell 32 includes a capsular main portion 321 surrounding the mating tongue 301 to define said mating cavity 302 with a rear edge 3211 being retained on the retaining base 312, and a rear top portion 322 extending rearward and covering on the rear mounting portion 313 of the insulating housing. The metallic shell 32 further includes a pair of mounting legs 323 extending downwards from lateral sides of the rear top portion 322 for mounting to the printed circuit board 900 and a pair of locking tabs 324 received in the recesses 314 of the rear top portion 313 after the metallic shell 32 is rearwardly assembled to the housing 31 in a front-to-back direction. A metallic bracket 325 is soldered under the shell 32 and forms a pair of supporting legs 3251 mounted to the printed circuit board 900 for supporting the receptacle connector 300 within the notch 92 of the printed circuit board.

Figure 19:
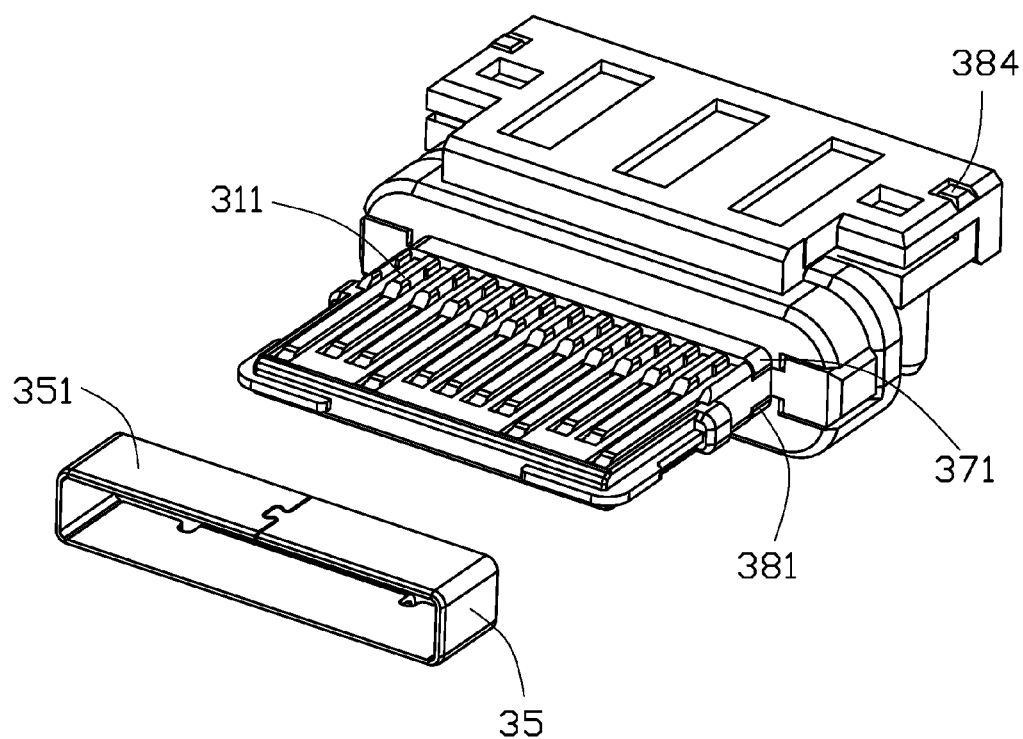
FIG. 19 is a front partially exploded perspective view of the receptacle connector of FIG. 18 without the shield thereof.
Figure 20A:
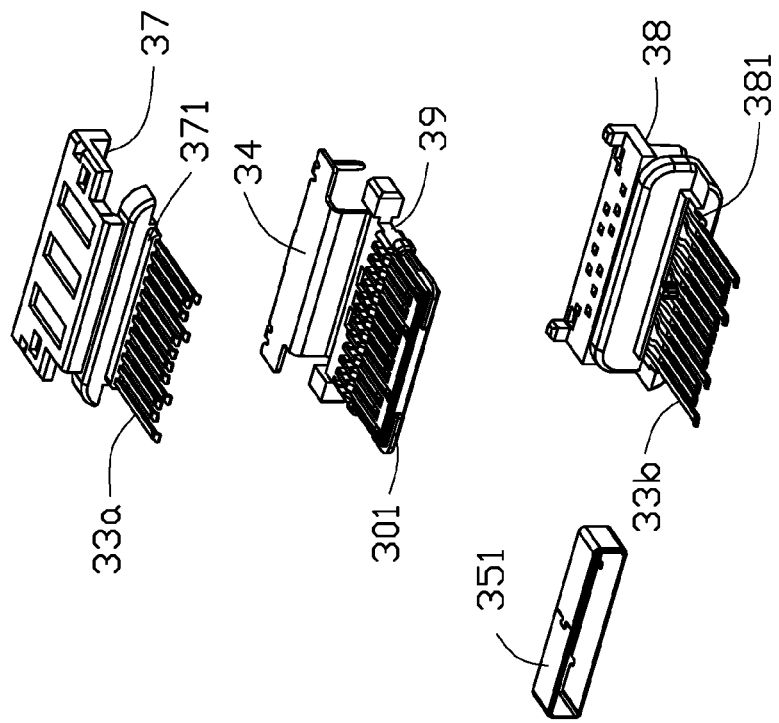
FIG. 20(A) is a front partially exploded perspective view of the receptacle connector of FIG. 16.
Figure 20A:
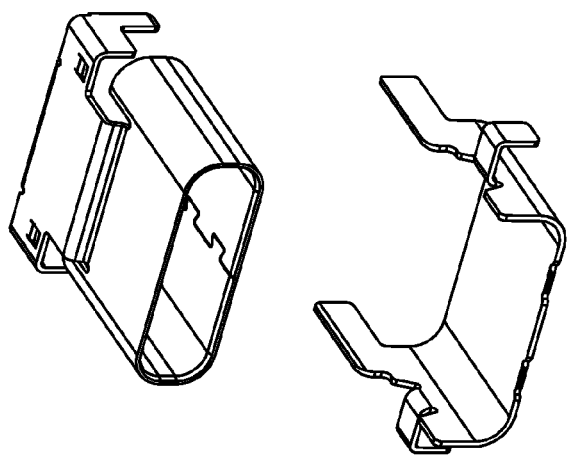
Figure 20B:
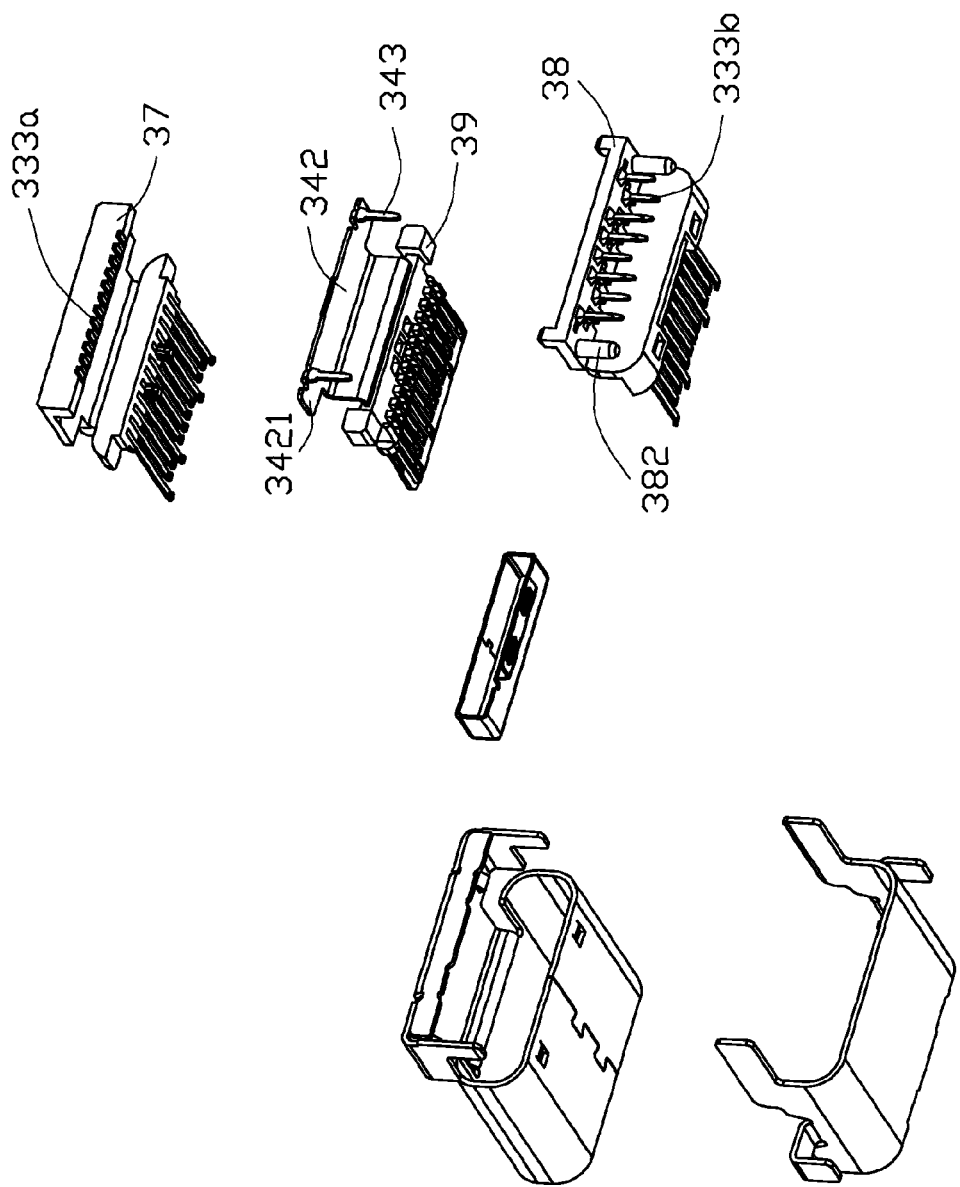
FIG. 20(B) is a rear partially exploded perspective view of the receptacle connector of FIG. 16.

As best shown in FIG. 20(A)-20(B), the insulating housing 31 is composed of the upper piece 37 and a lower piece 38 commonly sandwiching therebetween a middle piece 39 which forms the mating tongue 301. The upper row contacts 33a are associated with the upper piece 37, the lower row contacts 33b associated with a lower piece 38 and the shielding plate 34 is associated with the middle piece 39 via an insert molding process wherein the contacting sections 332 of the upper row contacts 33a and those of the lower rows contacts 33b are seated upon opposite upper surface and lower surface of the mating tongue 301, respectively, as mentioned before. A rear portion of the step structure 312 is removed to, as best shown in FIG. 19, have a front edge region 371 of the upper piece 37 and the front edge region 381 of the lower piece 38 sandwiched between the middle piece 39 and the loop structure 351 of the EMI collar 35 so as to enhance the strength during mating under some bending.

In this embodiment, the shielding plate 34 defines a rear portion 342 extending from the mating tongue 301, a vertical middle portion 349 connecting with the front portion 341 and the rear portion, and a pair of mounting legs 343 bending downwards from the rear edge of the rear portion 342 so as to efficiently separate the upper row contacts 33a and the lower row contacts 33b from each other wherein the upper row contacts 33a form the surface mount type tail sections 333a while the lower row contacts 33b form the through hole type tail sections 333b. The lower piece 38 includes a pair of mounting posts 382 for mounting the housing 31 to the printed circuit board 900. The rear portion 342 of the shielding plate further extend a pair of lateral wings 3421 from opposite sides of the rear portion 342, the pair of lateral wings 3421 are disposed in the base of the insulative housing.

Figure 21A:
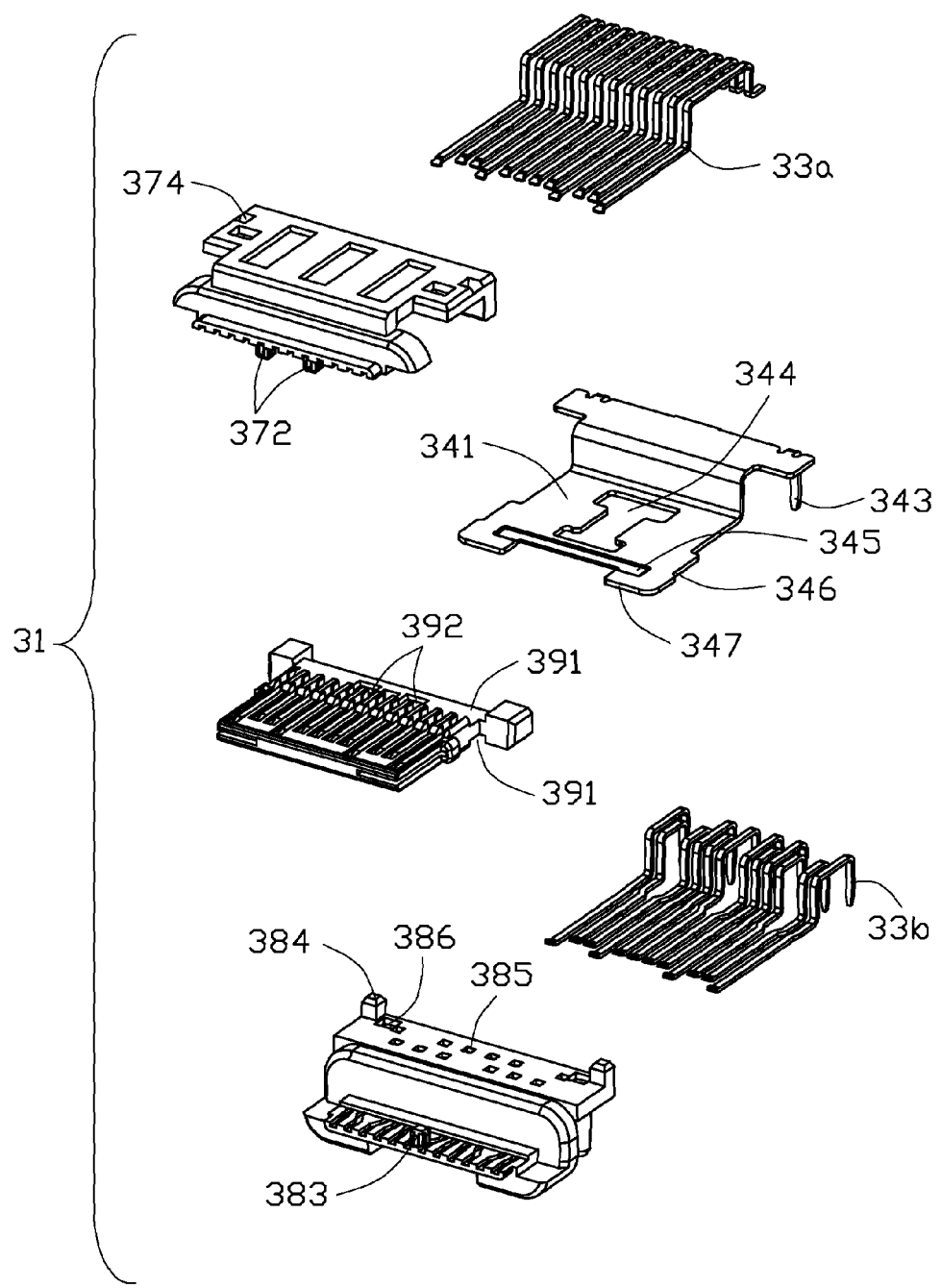
FIG. 21(A) is a front partially exploded perspective view of the receptacle connector of FIG. 20(A) to show the housing and the contacts thereof.
Figure 21B:
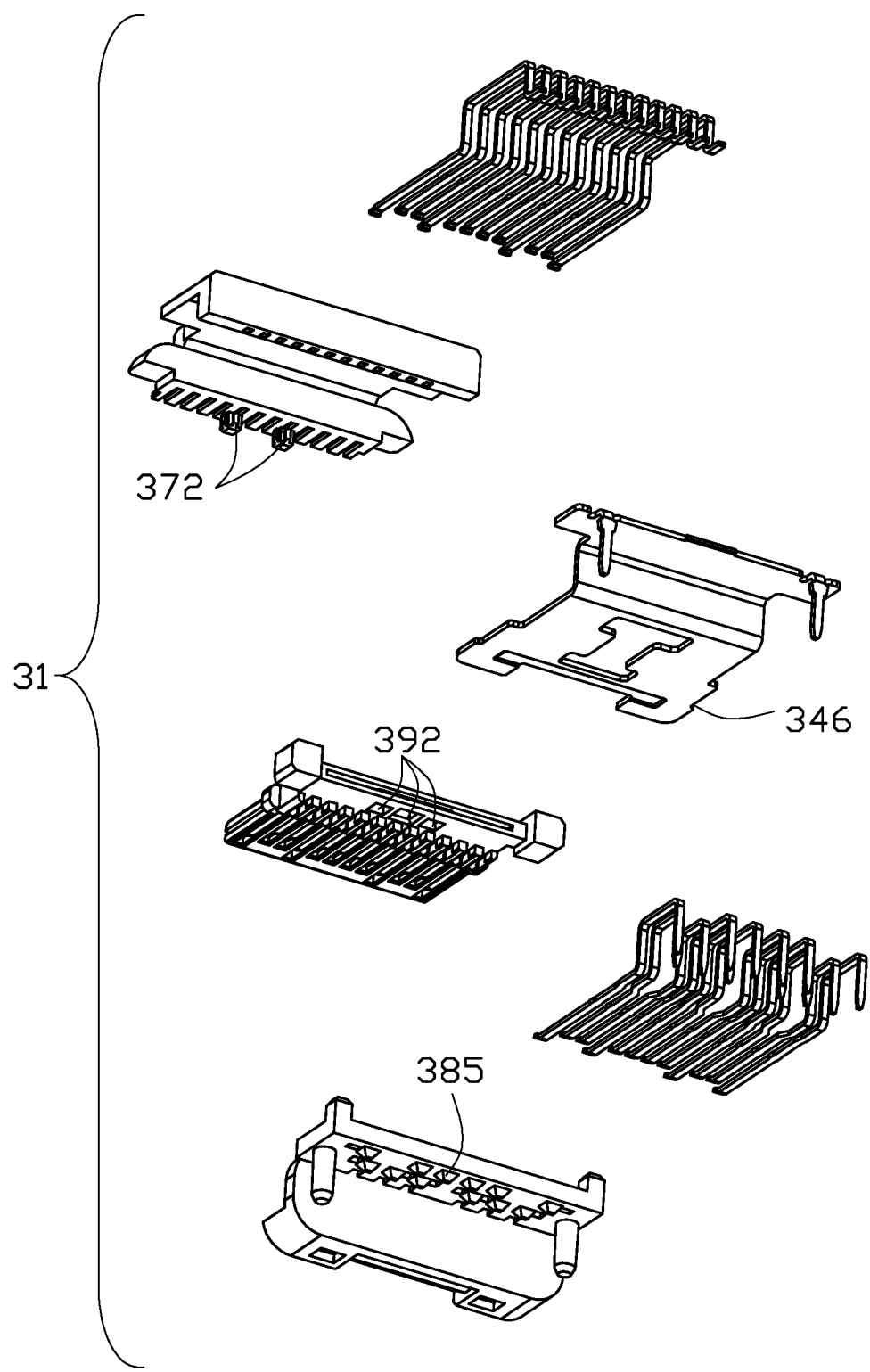
FIG. 21(B) is a rear partially exploded perspective view of the receptacle connector of FIG. 20(B) to show the housing and the contacts thereof.
Figure 22:
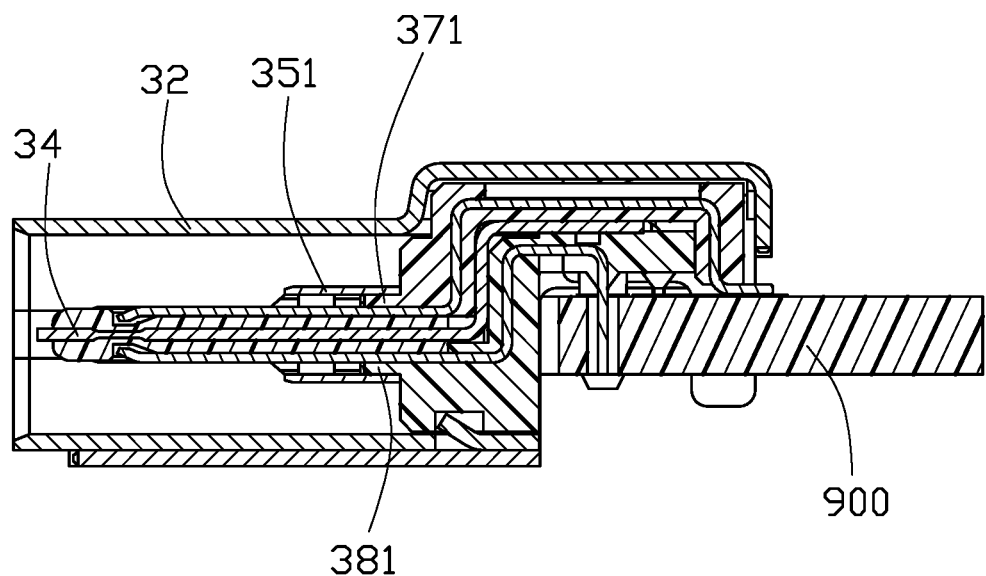
FIG. 22 is a cross-sectional view of the receptacle connector on the printed circuit board taken along lines 22-22 in FIG. 17.
Figure 23:
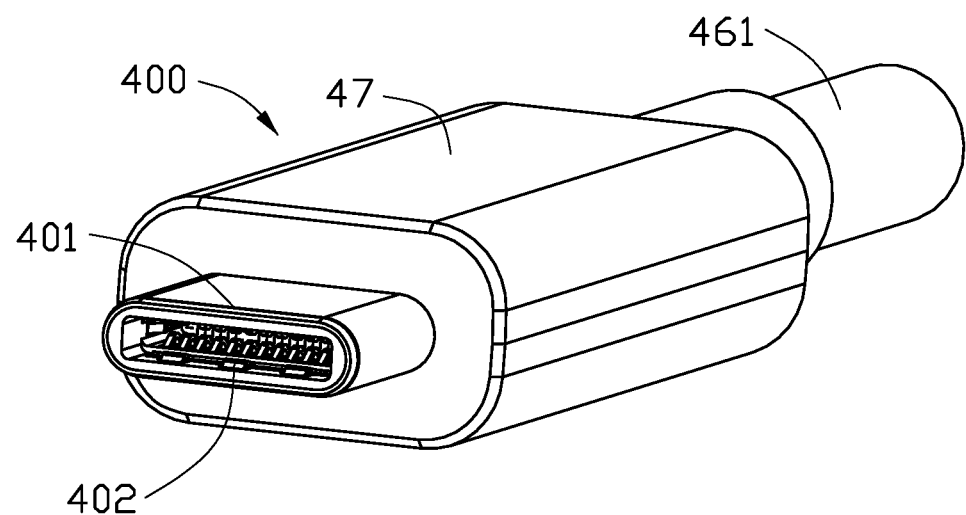
FIG. 23 is a front assembled perspective view of the plug connector of FIG. 13.
Figure 24A:
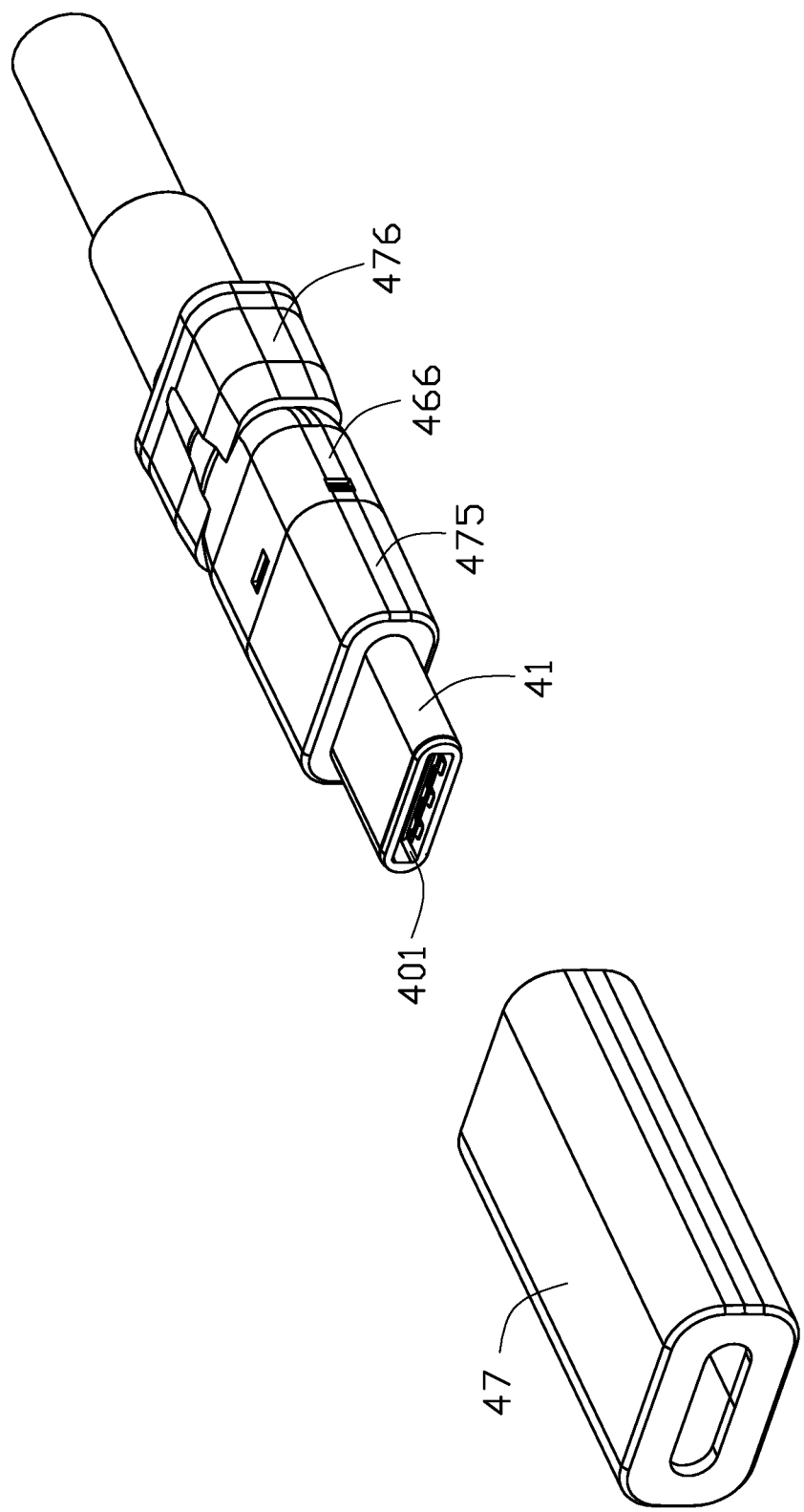
FIG. 24(A) is a front partially exploded perspective view of the plug connector of FIG. 23 wherein the cover is removed away from the remainder.
Figure 24B:
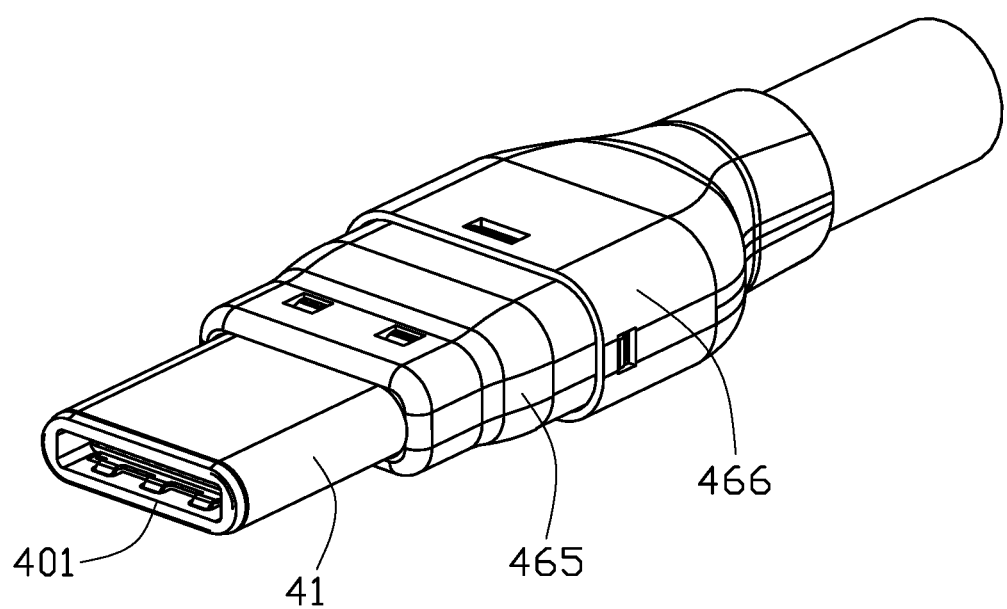
FIG. 24(B) is a front partially exploded perspective view of the plug connector of FIG. 23 wherein the front and rear over-moldings have been further removed.
Figure 25:
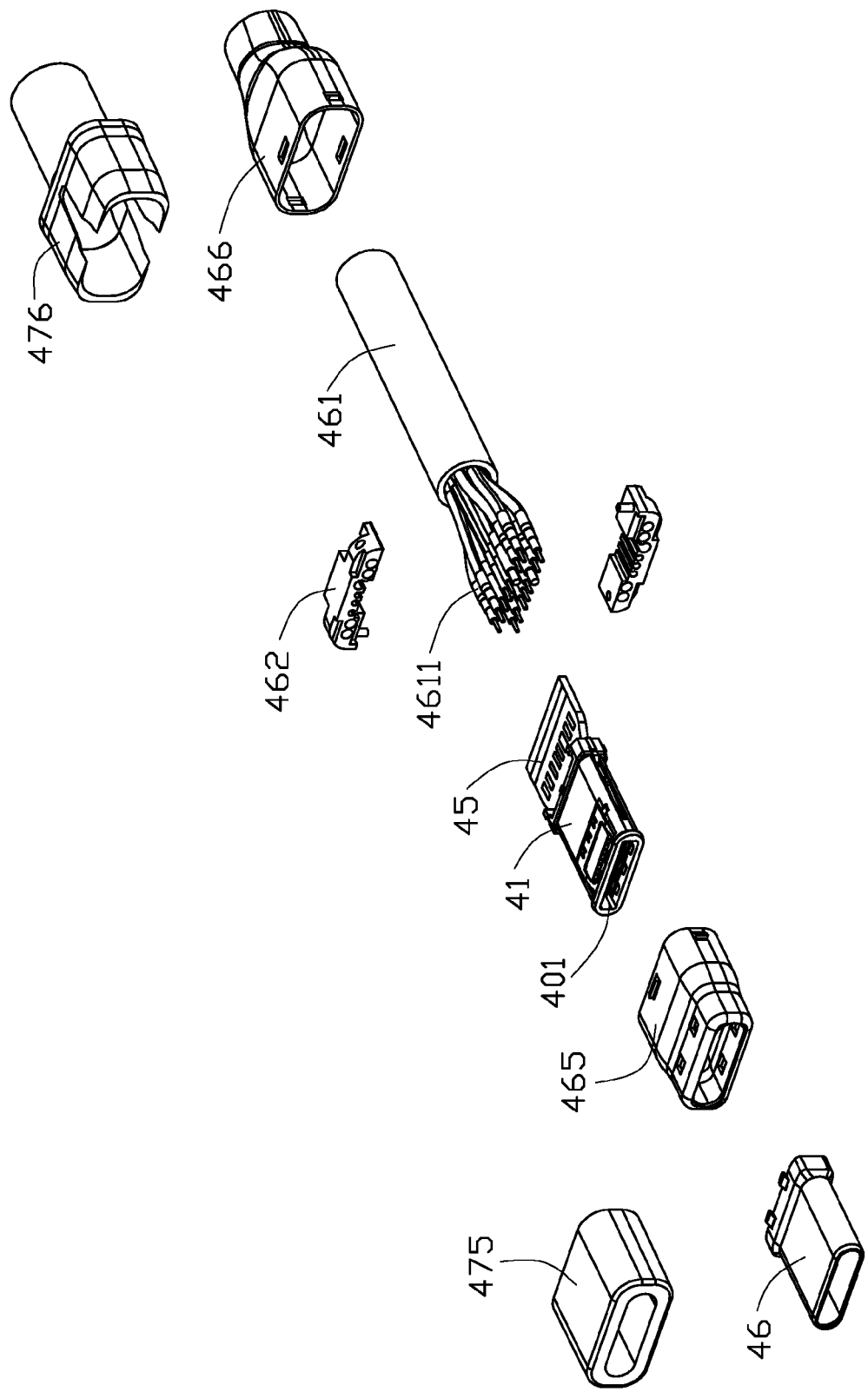
FIG. 25 is a front partially exploded perspective view of the plug connector of FIG. 23 without the cover thereof.

Referring to FIGS. 21(A)-21(B), in this embodiment, the shielding plate 34 defines an opening 344 and a thinner area 345 at a front portion 341 for both securing and impedance consideration. Notably, the shielding plate 34 forms a front edge section 347 extending forwardly beyond a front edge of the mating tongue 301 for anti-mismsting consideration, and a pair of lateral edge sections 346 for locking with a latch 44 of the plug connector 400 (illustrated later).

The middle piece 39 forms a pair of recesses 391 to respectively receive the front edge region 371, 381 of the upper and lower pieces 37, 38 as labeled in FIG. 20(A) and holes 392 defined in the recesses 391 to respectively receive corresponding protrusion posts 372 of the upper piece 37 for securing the upper piece 37 and the middle piece 39 therebetween in a stacked manner wherein the lower piece 38 further forms a pair of upward locating posts 384 received within the corresponding recesses 374 in the upper piece 37, combination with FIG. 19. In this embodiment, the lower piece 38 defines a plurality of through holes 385 and 386 to receive the tail sections 333b of the lower row contacts 33b and the mounting legs 343 of the shielding plate 34 to extend therethough as an alignment spacer. In brief, the shielding plate 34 is essentially multifunctional to perform shielding, grounding, reinforcing, anti-mis-mating and locking.

Figure 26:
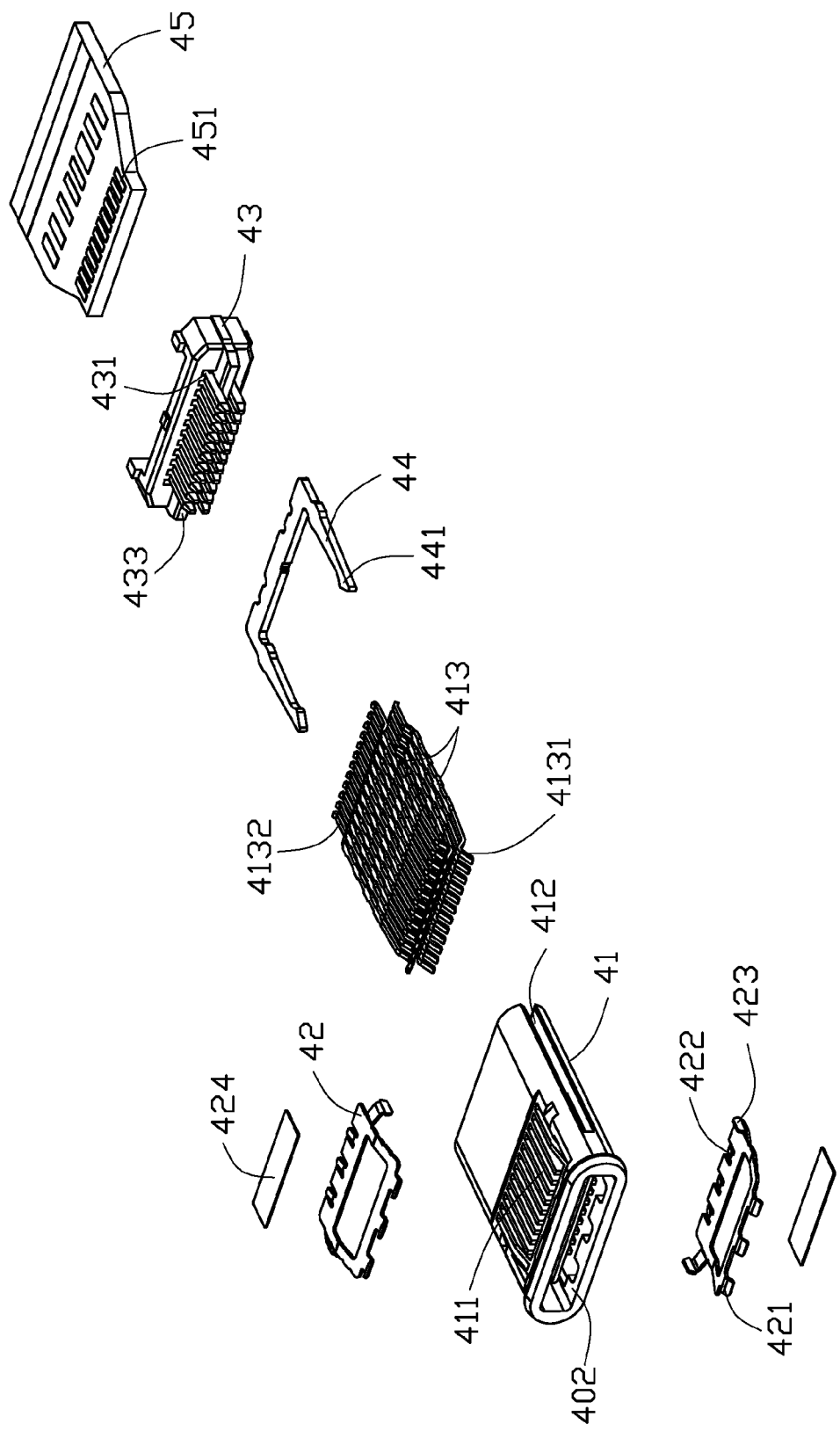
FIG. 26 is a front partially exploded perspective view of the plug connector of FIG. 25 by removal of additional parts therefrom.
Figure 27:
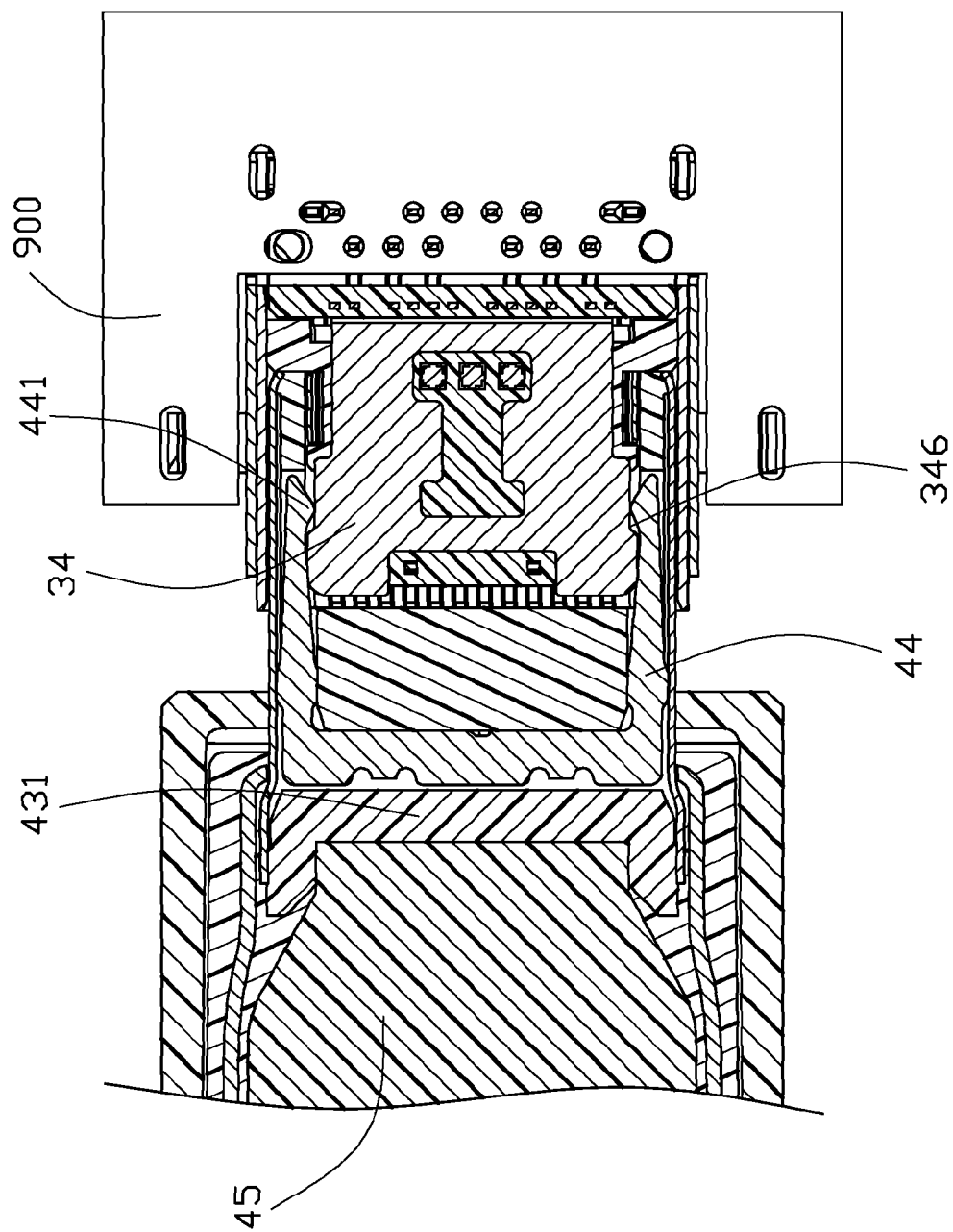
FIG. 27 is a cross-sectional view of the mated plug connector and receptacle connector of FIG. 13.
Figure 28A:
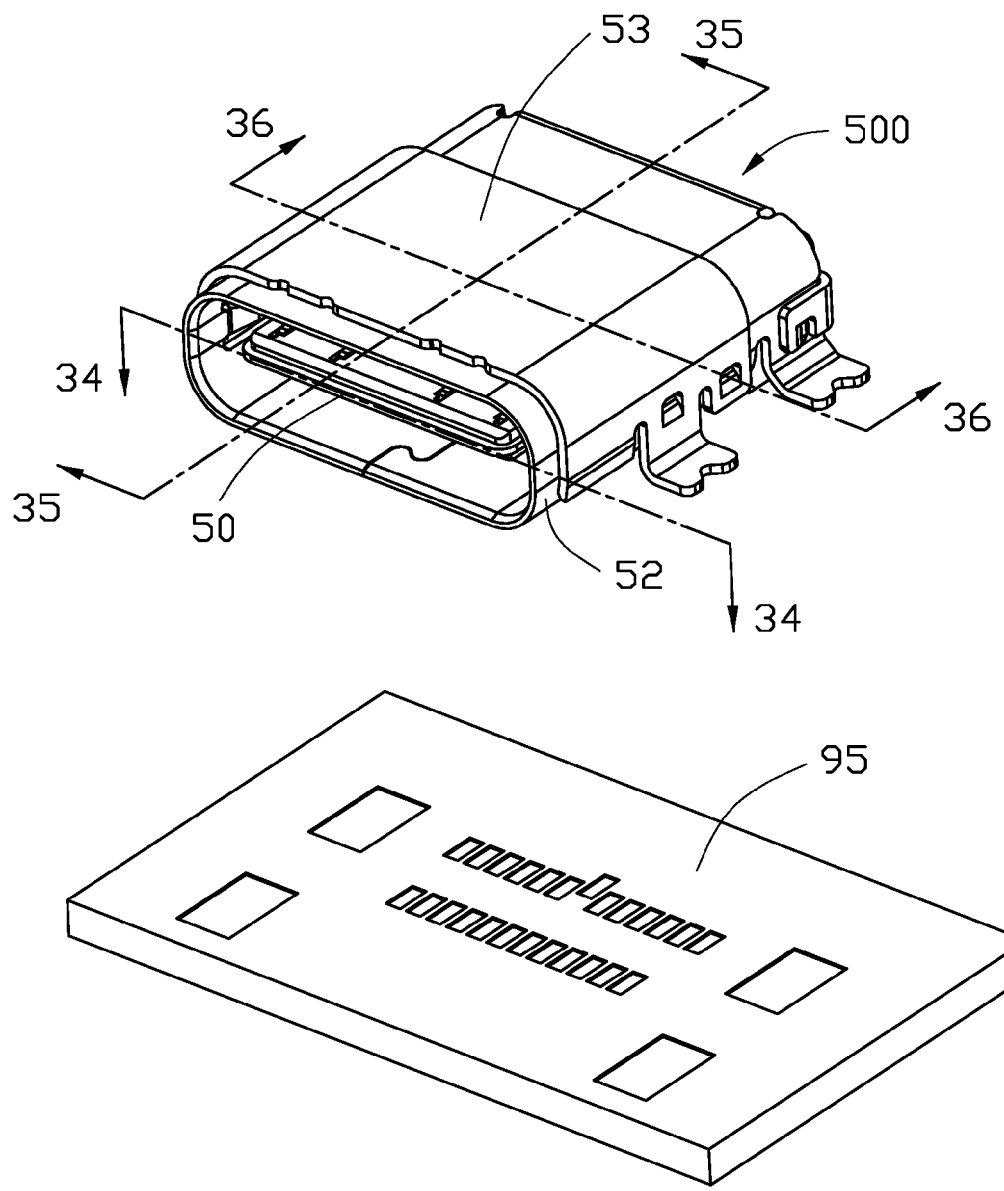
FIG. 28(A) is a front partially exploded perspective view of the receptacle connector moved away from the printed circuit board of a third embodiment.
Figure 28B:
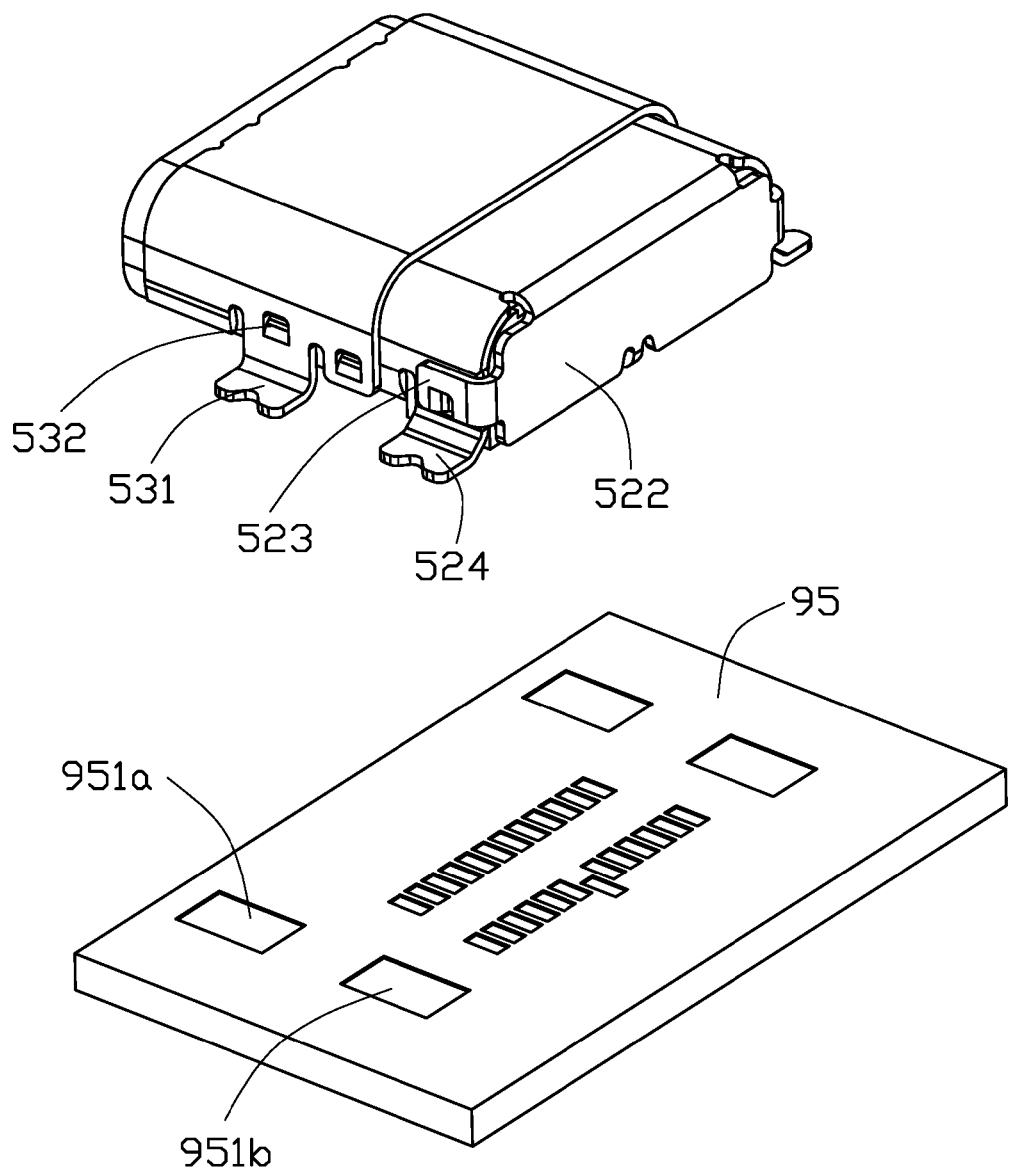
FIG. 28(B) is a rear partially exploded perspective view of the receptacle connector moved away from the printed circuit board of FIG. 28(A).
Figure 29:
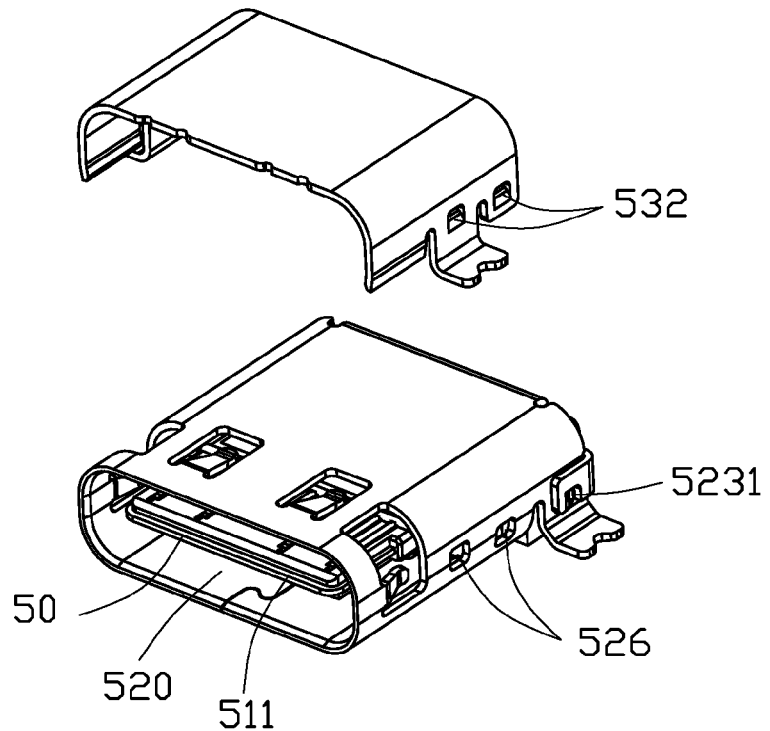
FIG. 29 is a further front partially exploded perspective view of the receptacle connector of FIG. 28(A)
Figure 30A:
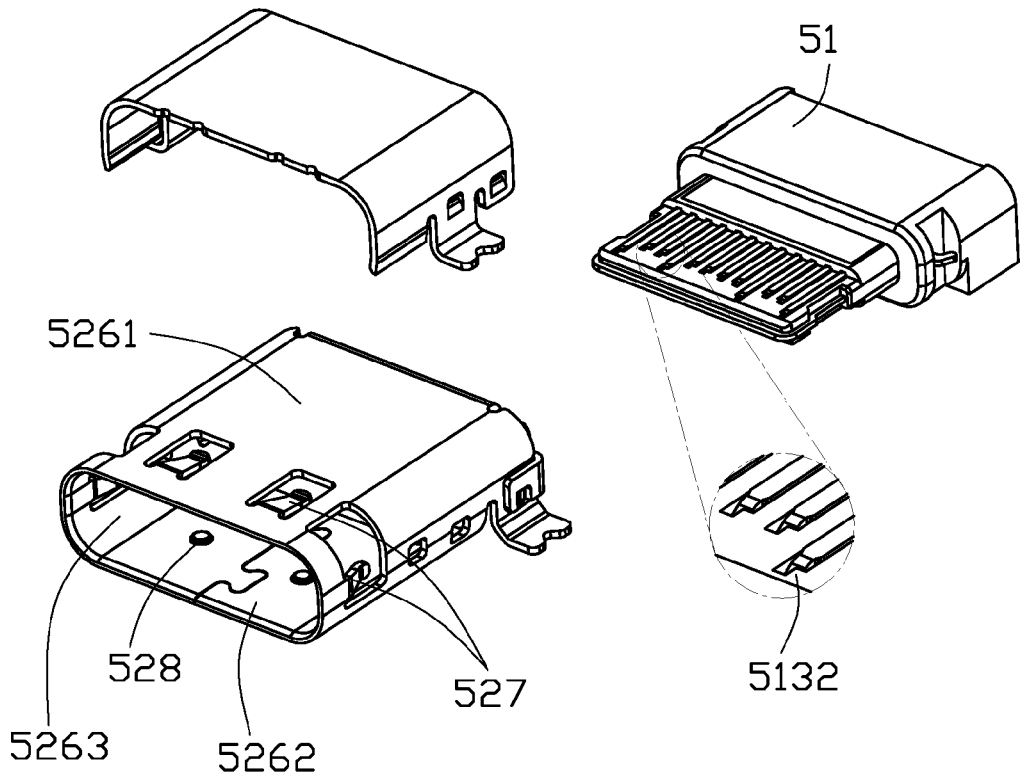
FIG. 30(A) is a further front partially exploded perspective view of the receptacle connector of FIG. 29.
Figure 30B:
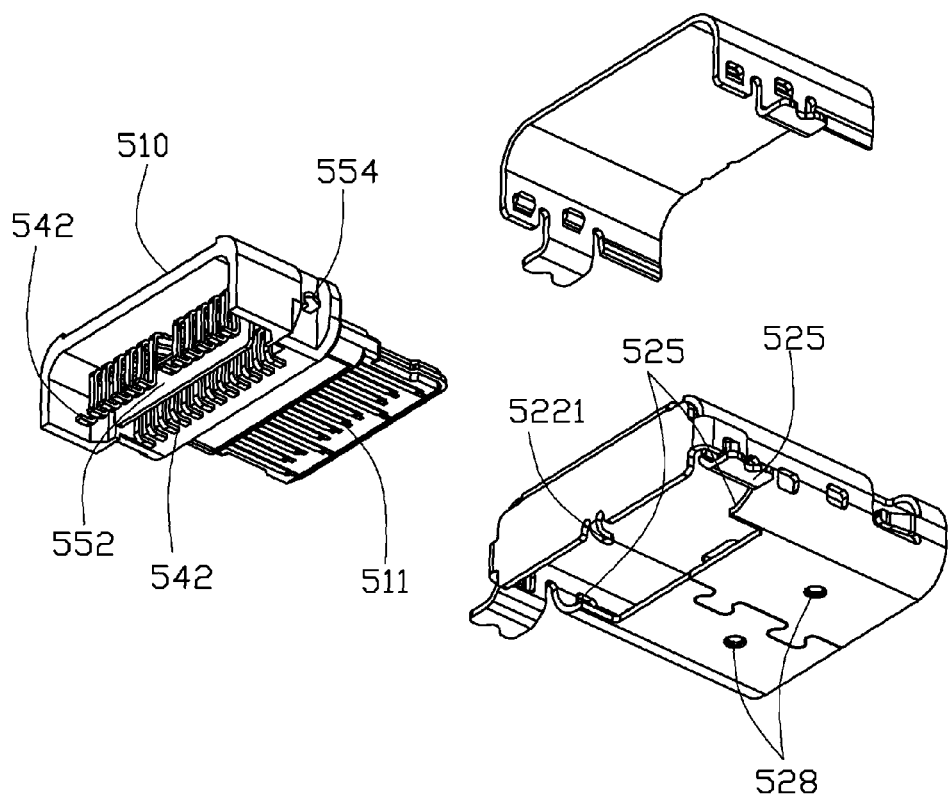
FIG. 30(B) is a further rear exploded perspective view of the receptacle connector of FIG. 29.
Figure 31:
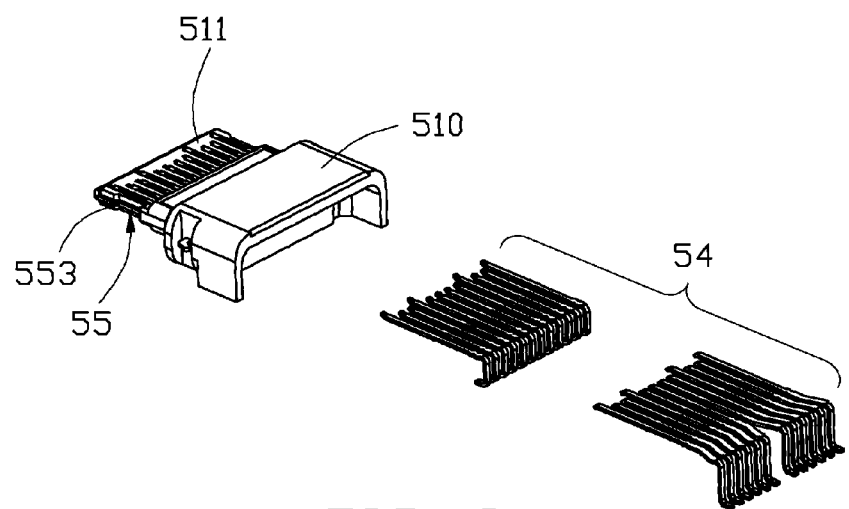
FIG. 31 is a further rear exploded perspective view of the terminal module of the receptacle connector of FIG. 30(B)
Figure 32A:
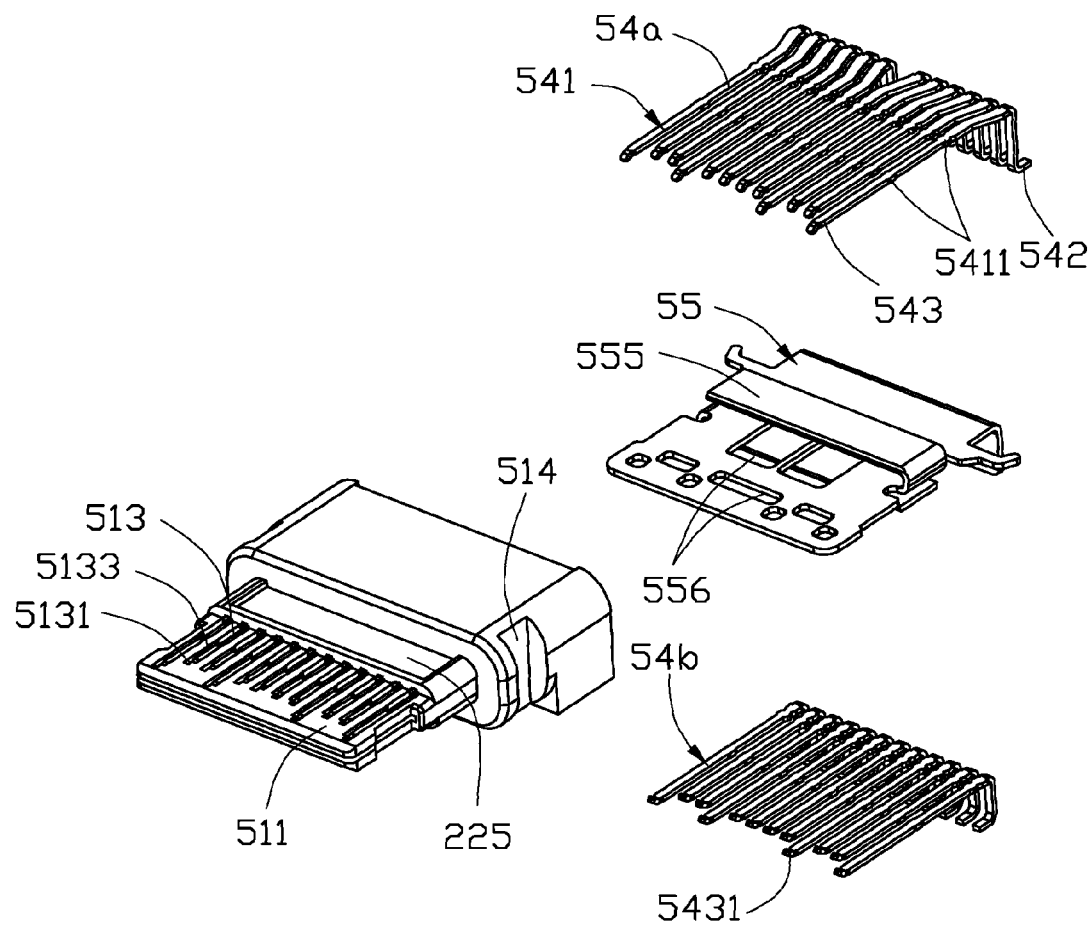
FIG. 32(A) is a further front exploded perspective view of the receptacle connector of FIG. 31
Figure 32B:
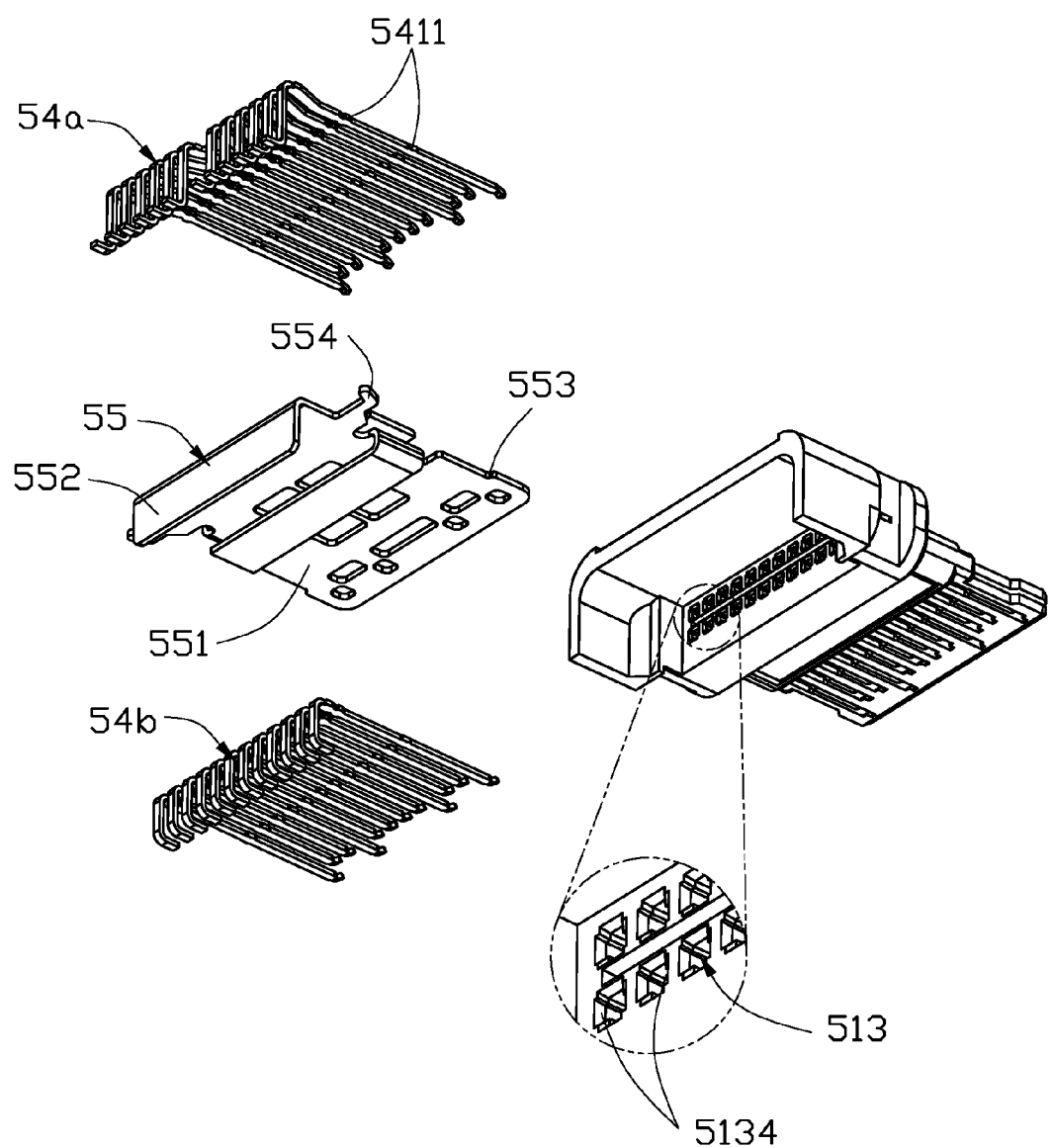
FIG. 32(B) is a further rear exploded perspective view of the receptacle connector of FIG. 31.
Figure 33A:
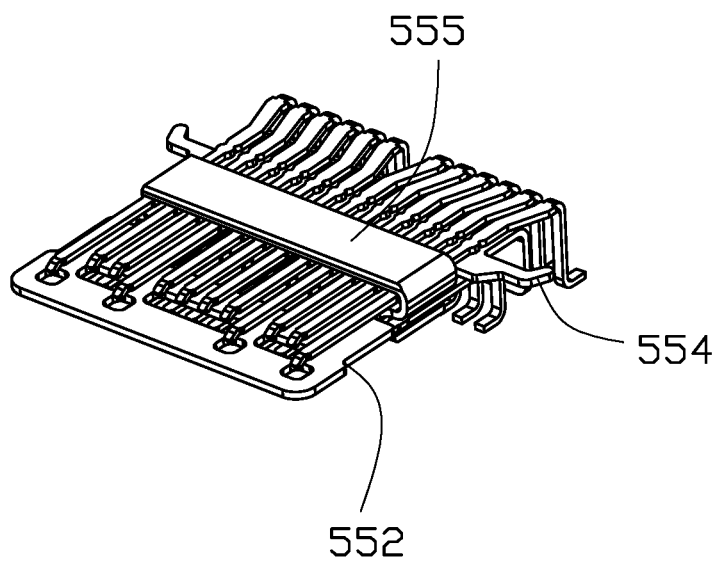
FIG. 33(A) is a front exploded perspective view of the shielding plate and the contacts of the receptacle connector.
Figure 33B:
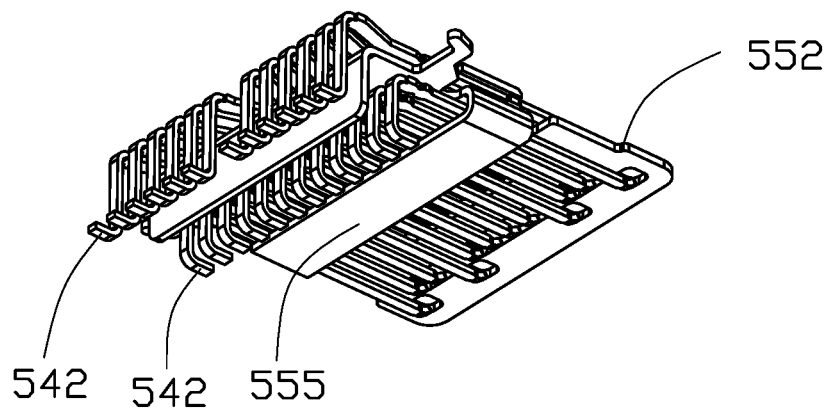
FIG. 33(B) is a rear exploded perspective view of the shielding plate and the contacts of the receptacle connector of FIG. 13.
Figure 34:
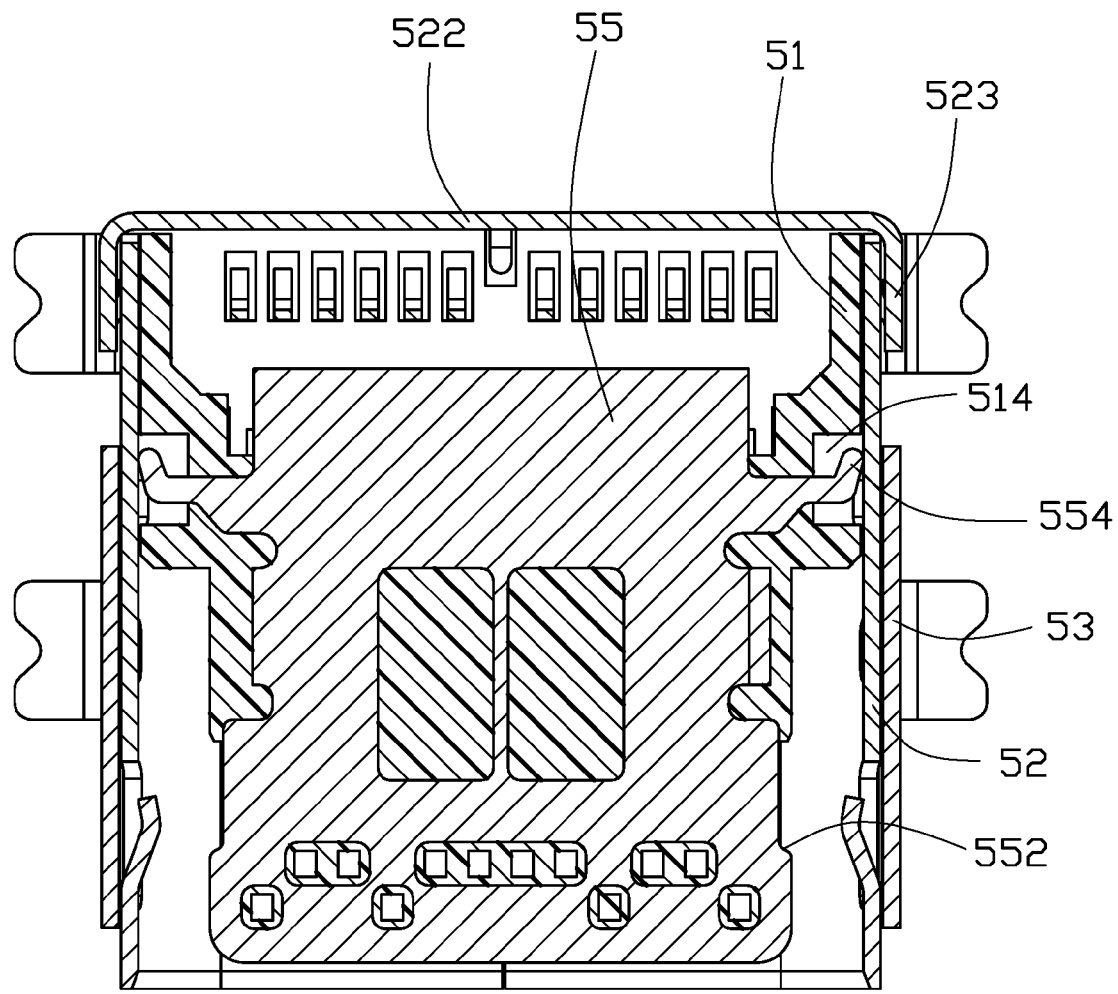
FIG. 34 is a horizontal cross-sectional view of the receptacle connector mounted upon the printed circuit board taken along lines 34-34 in FIG. 28(A)
Figure 35:
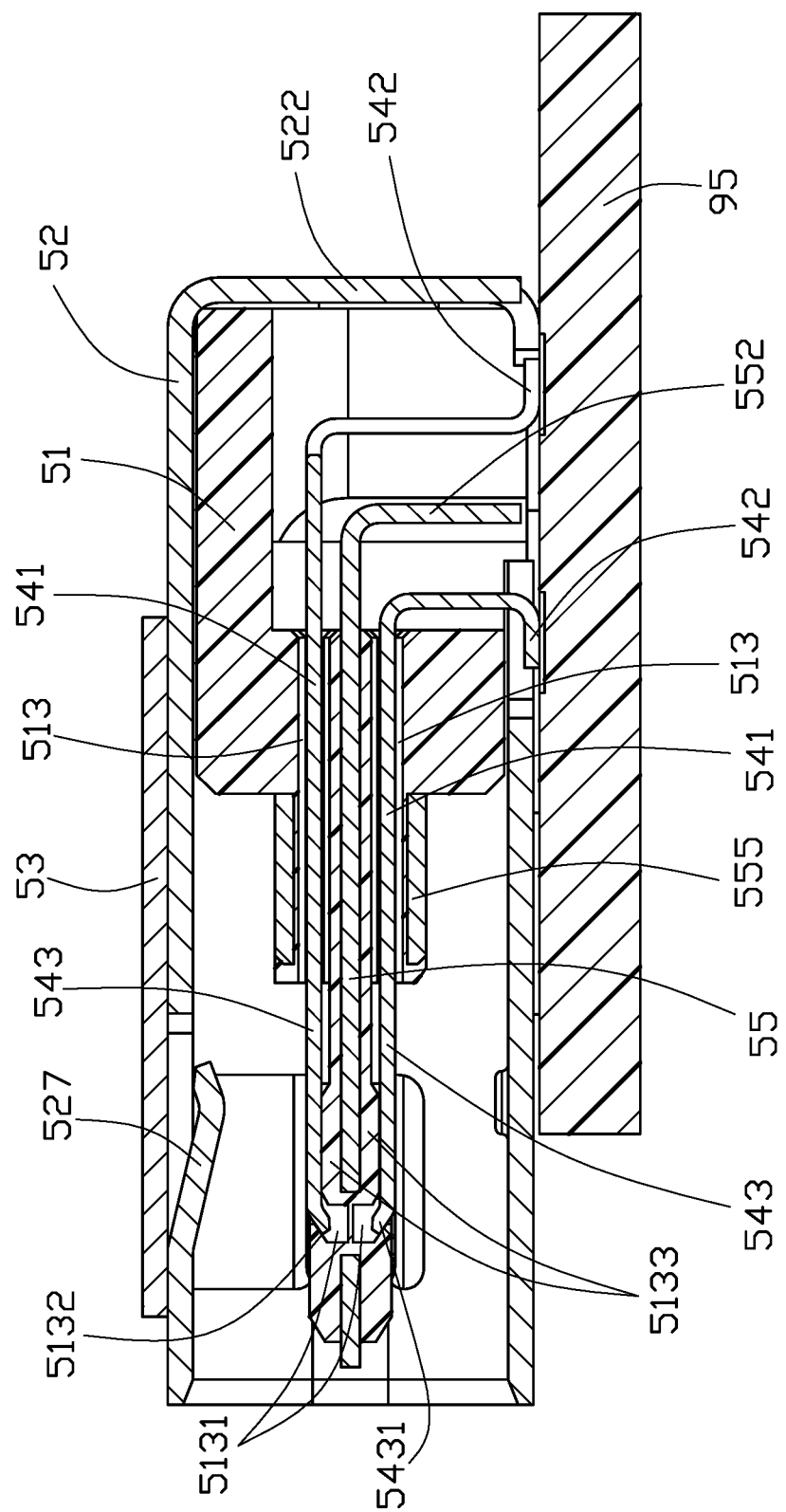
FIG. 35 is a side vertical cross-sectional view of the receptacle connector mounted upon the printed circuit board taken along lines 35-35 in FIG. 28(A)
Figure 36:
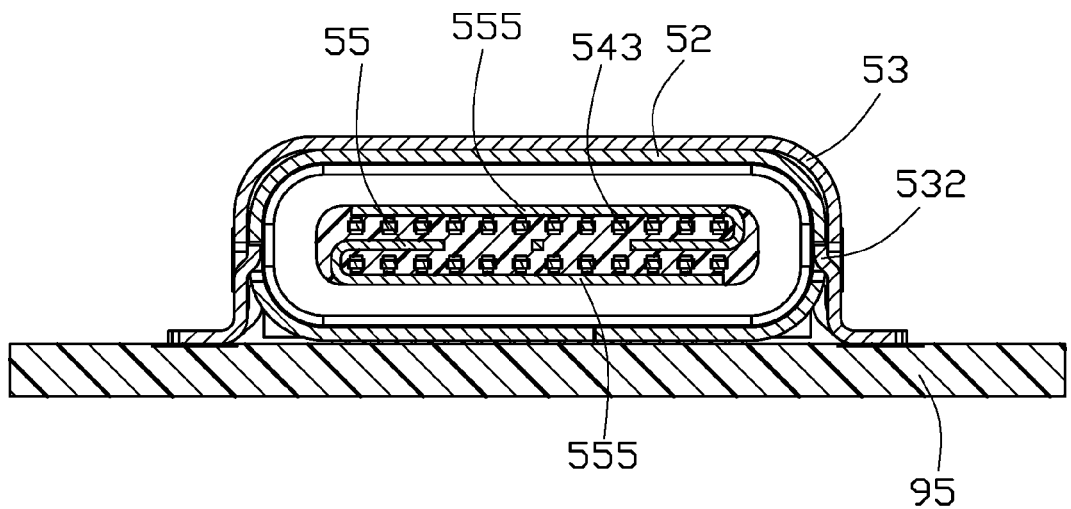
FIG. 36 is a front vertical cross-sectional view of the receptacle connector mounted upon the printed circuit board taken along lines 36-36 in FIG. 28(A)

Referring to FIGS. 23-26(B) and further FIG. 27, the plug connector 400 includes a mating end 401 with a rectangular cavity 402, a cable 461 extending rearwards and a molded insulative cover 47 around the mating end 401 and the cable 461.

Combination with FIG. 26, the plug connector 400 includes an insulative housing 41 having a capsular front contour with the rectangular receiving cavity 402 therein and enclosed in a metallic shell 46. Opposite upper and lower rows of contacts 413 are disposed in the corresponding passageways 411 of the housing with corresponding contacting sections 4131 extending into the receiving cavity 402. A pair of upper and lower EMI (Electro-Magnetic Interference) spring plates 42 are enclosed in the shell, and each of the EMI spring plates 42 is sandwiched between the shell 16 and the housing 41 and includes a front resilient region 421 extending inwardly toward the receiving cavity 402 and in front of the contacting sections 4131, a rear abutting region 422 to abut against the shell 16, and a pair of side retention regions 423 retainably engaged within corresponding side portions of the housing 41. The front resilient region 421 is in a form of slant-inwardly tabs extending therefrom. The rear abutting regions 422 is in a from of a plurality of slant-outwardly tabs splitting therefrom. A pair of insulative tapes 424 are disposed upon two opposite sides of the housing 21 so as to isolate the contacting section 4131 from the shell 46. A spacer 43 is located behind the housing and defines a plurality of passages 431 through which the tail sections 4132 of the contacts 413 rearwardly extend. A recessed region is formed in a rear face of the spacer 43 to receive a front edge region of a paddle card 45 wherein the tail sections 4132 of the contacts 413 extending through the corresponding passages 431, are soldered upon the corresponding pads 451. The spacer 43 forms a forward extending blade 433 with a pair of forward protrusions on two faces in the vertical direction to be commonly inserted into a back side of the housing 41 wherein the blade 433 is essentially received in the side slots 412 of the housing 41. A U-shaped metallic latch 44 received in the side slots 412 of the housing 41 with a pair of locking heads 441 extending into the two opposite lateral sides of the receiving cavity 401 to lock with the lateral edge sections 346 of the shielding plate 34 of the receptacle connector 300 during mating. Understandably, the latch 44 is restrained by the blade 433, the slots 13 and an interior rear face of the housing 41.

Referring to FIG. 24(A)-27, a cable 461 behind the paddle card 45, encloses a plurality of wires 4611 regulated by a pair of organizer 462 to be soldered upon a rear region of the paddle card 45. An auxiliary rear shell 465 grasps the shell 46 to shield the paddle card 45, and a clipper 466 grasps the cable 461 behind the paddle card 45. Opposite front overcoat 475 and rear overcoat 476 are overmolded upon the rear shell 465 and the clipper 446, respectively. Finally, the cover 47 essentially fully covers the clipper 466, the front overcoat 475 and the rear overcoat 476. During mating, the mating tongue 301 is received in the receiving cavity 401 with the corresponding contacting sections 322 of the contacts 32 of the receptacle connector 300 connected to the contacting sections 4131 of the contacts 413 of the plug connector 400 wherein the latch 44 is locked with the shielding plate 34, and the front resilient region 421 of the spring plate 42 contacts the collar 35.

Referring to FIG. 28(A) through FIG. 36, according to a third embodiment of the invention the receptacle connector 500 mounted upon the printed circuit board 95, includes a terminal module 50 enclosed in the metallic shield 52 with a metallic bracket 53, which is surface-mounted upon the printed circuit board 95.

The shield 52 forms a mating cavity 520 into which the mating tongue 511 forwardly extending, and a plurality of spring tangs 527 extending rearwards and a plurality of dimples 528 for holding the plug connector. The shield 52 consists of opposite first and second long wall 5261, 5262 and two short side walls 5263 connecting with the longer walls. Two spring tangs 527 are defined on the first longer wall 5261, one spring tang 527 is defined on the side wall 5263, and the two dimples 528 are formed on the second long wall 5262. A rear wall 522 unitarily extends from a rear edge of the shield 51 to cover the back of the housing 51 with two ears 523 locked to the two lateral sides of the side walls 5263 of the shield 51 and surface mounting type tail 5221. The ear 523 further defines an inward-protruding tab 5231 pressing against the side wall for locking. Notably, the shield 51 essentially constitutes a capsular form with two vertical side walls 5263 for locking the corresponding ears 523 where a pair of horizontal mounting pads 524 is formed for surface mounting to the pad 951b of the printed circuit board 95. The shield 51 includes a curved rear edge 525 rearwardly abuts against the base 510 of the housing 51. The bracket 53 is attached to the shield 210 via tabs 532 locking with the openings 526 on side walls 5263 and mounted to the printed circuit board via mounting pads 531 soldered to the pads 951a. At the same time, the bracket 53 fitly cover the spring tangs 527 to seal opening around the spring tangs while not cover the dimple since there is not openings around the dimples. There is no openings or slits for engagement with the corresponding plug connector, thus keeping integrity of the capsular front mating port section under EMI shielding consideration.

The terminal module 50 includes an insulative housing 51, two rows of contacts 54 and a shielding plate 55. The insulative housing 51 includes a base 510 and a front mating tongue 511. Two rows of passageways 513 extends along a front-to-back direction in the housing 51, and each passageway 513 forms an inward recession 5131 at a front end with a protection flange 5132 (labeled in FIG. 30(A)) thereabouts, and a platform 5133 behind the recession 5131. A pair of opposite grooves 5134 are located on two lateral sides of each passageway 513. A plurality of contacts 54 are forwardly inserted to the corresponding passageways 513, respectively. Each contact 54 includes a horizontal main body 541 with two pairs of barbs 5411 on two lateral edges to be engaged within the corresponding grooves 513 in an interference fit, a surface mount tail 542 behind the main body 541, and a contacting section 543 in front of the main body 541 with a tip 5431 inwardly embedded with the recession 5131. The tails 542 are laterally offset from the main bodies 541 of the corresponding contacts 54a of the upper row with two opposite group while the those of the corresponding contacts of the lower row 54b are still densely arranged with one another without offsetting. On the other hand, the tails 542 of the contacts 54a in the upper row and those in the lower row extend in opposite directions. Notably, the front section of the contacting section 543 is supported by the platform 5321 while the remaining contacting section 543 and the main body 541 are spaced from the housing 51 in the vertical direction with support by the pair of barbs 5411 in the grooves 513.

The metallic shielding plate 55 is insert molded within the housing 51 and between the two rows of the contacts 54 before the contacts 54 are inserted into the housing 51. The shielding plate 55 includes a first shielding portion 551 located between the contacts portions 543 of the upper and lower rows of contacts and a second shielding portion 552 located between the tails 542 of the upper and lower rows of the contacts. The shielding plate 55 forms a pair of locking side edges 553 for locking with the internal latch of the corresponding plug, a pair of spring arms 554 located on two lateral sides thereof and in corresponding recesses 514 in opposite two lateral sides of the housing 51 to mechanically and electrically connect to the shield 52, and a pair of contacting regions 555 unitarily extending respectively from two opposite lateral sides of the shielding plate 55 in a folded/parallel manner and exposed upon the step portion 5112 of the mating tongue 511 for coupling to the corresponding spring plates on the plug connector. Notably, the shielding plate 55 forms a plurality of through openings 556 to be filled with material of the housing 51 after the insert molding process for securing consideration.

Different from the previous first and second embodiment, this third embodiment discloses the receptacle connector 500 completely mounted upon the printed circuit board 95 rather than partially sunk in the notch of the printed circuit board as shown in the previous embodiment. The contacts 54 are assembled into the corresponding passageways 513 rather than via an insert-molding process. On the other hand, the rear wall 522 may efficient block an EMI in the front-to-back direction. The tip 5431 of the contacting section 543 is inward formed and received in the recession 5131 and partially protectively covered by the flange 5132 above the recession 5431 for superior protection without a risk of pup-up. Understandably, in this embodiment the housing 51 is restrained in the shield 52 via the rear wall 522 which forwardly abuts against a back side of the base 510 for blocking the rearward movement and via the rear edge 525 which rearward abuts against a forwardly facing vertical face of the base 510 for blocking the forward movement. The second shielding portion 552 may efficient block an EMI to the legs of the contacts 54 in the front-to-back direction.

Figure 37:
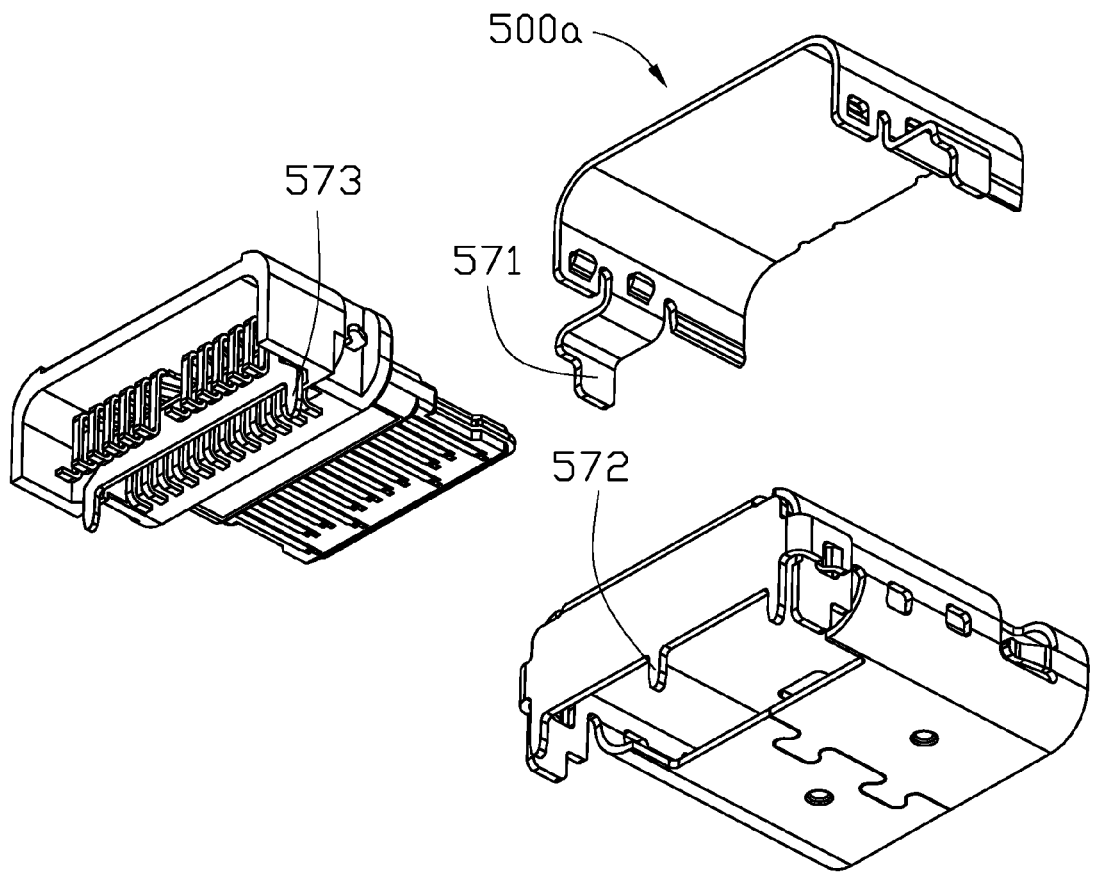
FIG. 37 is a rear exploded perspective view of a receptacle connector similar to the third embodiment.
Figure 38:
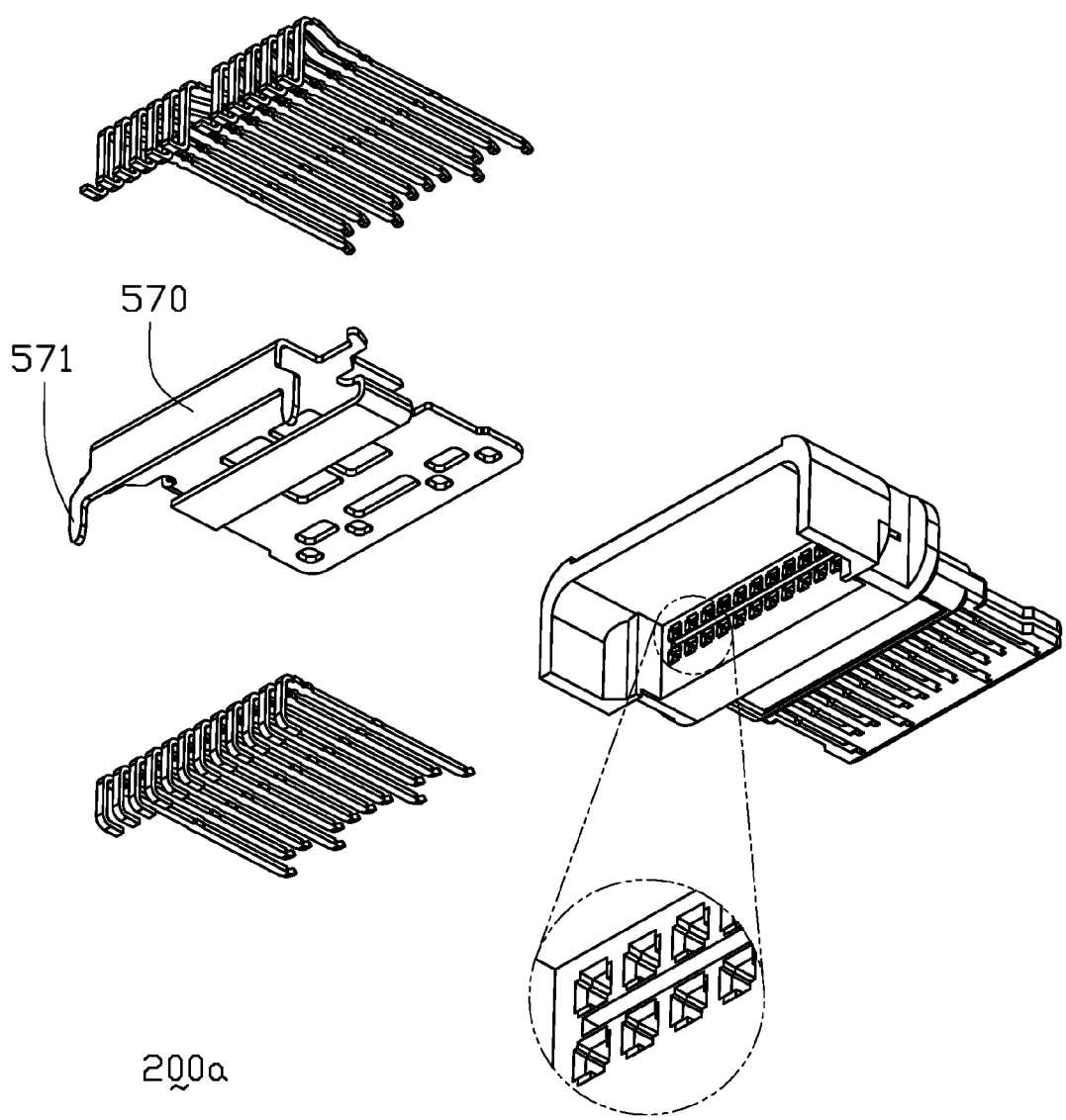
FIG. 38 is a further rear exploded perspective view of the receptacle connector of FIG. 37.

FIGS. 37-38 disclose another embodiment of the receptacle connector 500a essentially same as the previous third embodiment except the previous third embodiment is of a surface mount type while the current one is of the through hole type on the corresponding shield and bracket structure. The shield and the bracket define tails 571, 572 of through hole type. Anyhow, both of these two embodiments are of the surface mount type contacts, the tails of the contacts of the upper and lower rows extend in opposite directions. The shielding plate further defines two tails 573 from the rear shielding portion 570 thereof.

Figure 39:
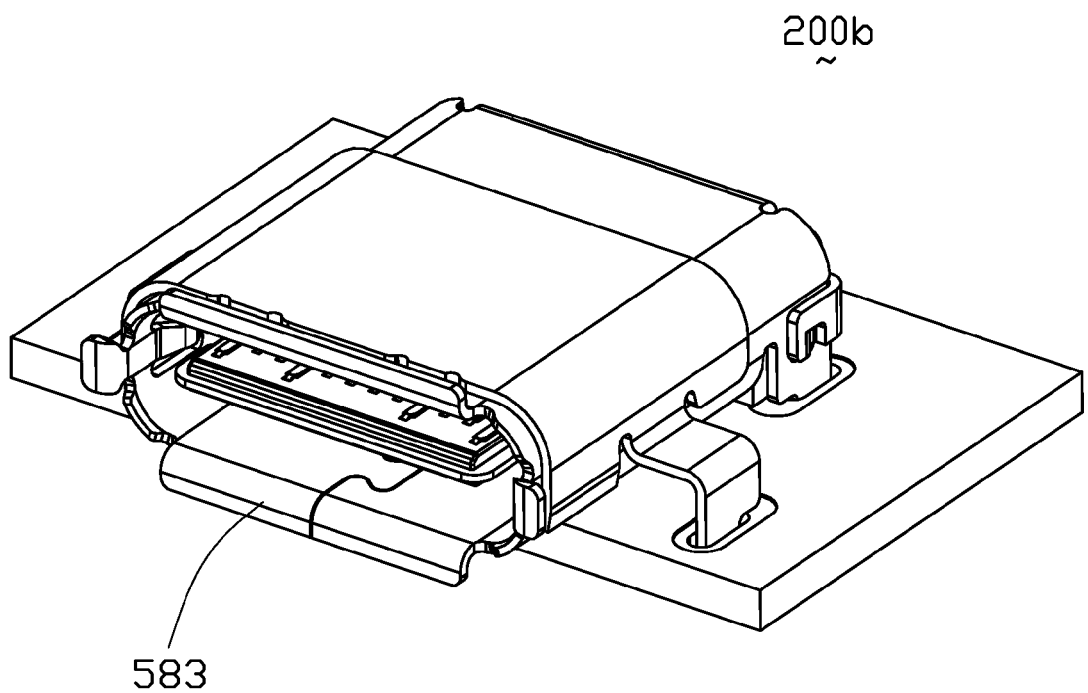
FIG. 39 is a front assembled perspective view of the receptacle connector mounted to the printed circuit board which is similar to the third embodiment.
Figure 40A:
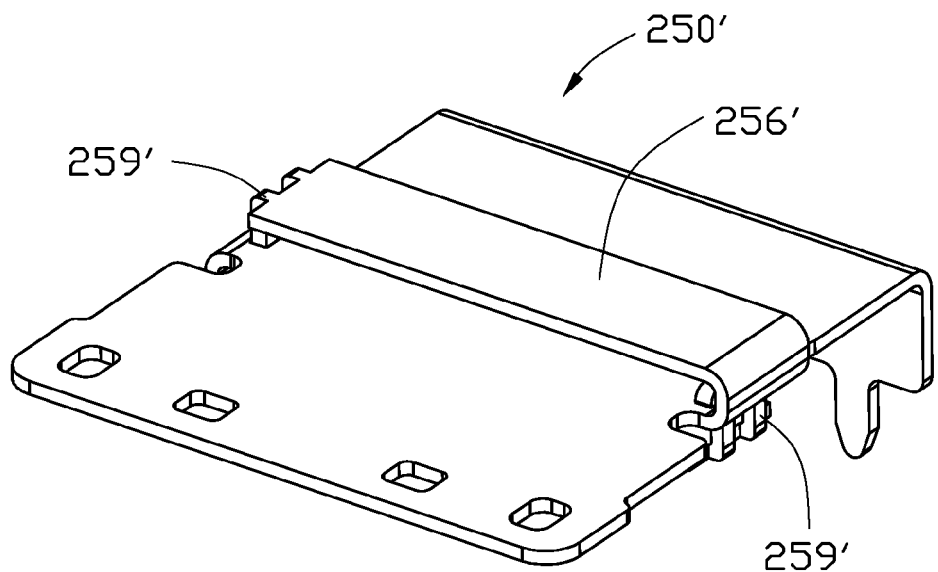
FIG. 40(A) is a front perspective view of the shielding plate in a final shape according to another embodiment of the receptacle connector of the invention.
Figure 40B:
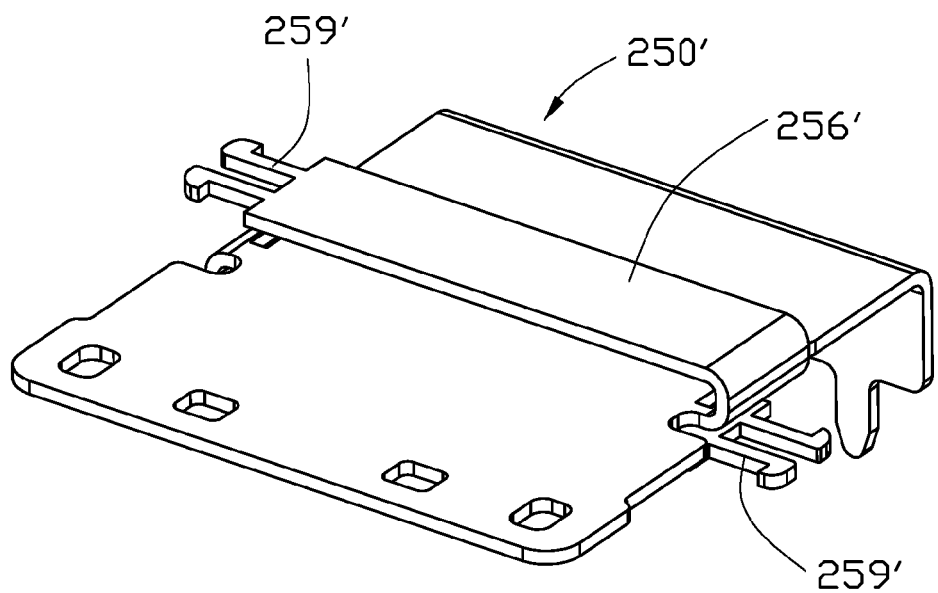
FIG. 40(B) is a front perspective view of the shielding plate of FIG. 40(A) in a semi-finished manner.

FIG. 39 show an another embodiment of the receptacle connector 200b similar to the embodiment disclosed in FIGS. 37-38 with tiny differences wherein the front edge 583 of the shield is equipped with a plurality of flared flanges for easy insertion of the plug connector. FIGS. 40(A) and 40(B) show another embodiment of the shielding plate 250' wherein the contacting regions 256' is equipped with a lance 259' at the tip to secured to the main body/the first shielding portion of the shielding plate 250' so as to prevent tilting of the contacting regions 256' relative to the shielding plate 250' during the high pressure insert molding process.

Figure 41A:
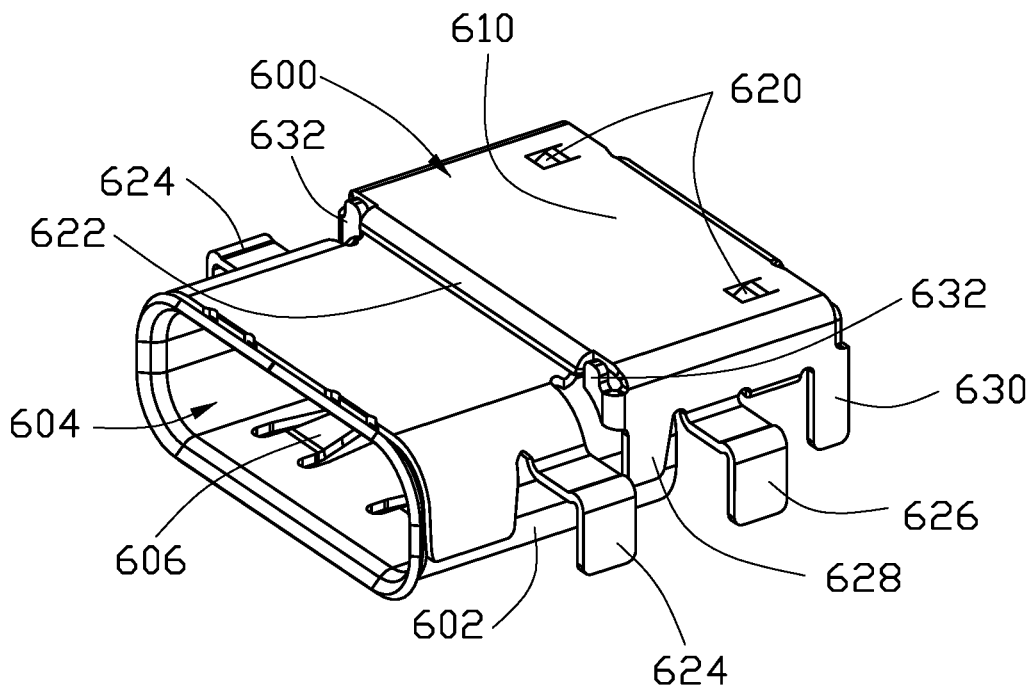
FIG. 41(A) is a front perspective view of the receptacle connector of a fourth embodiment of the invention.
Figure 41B:
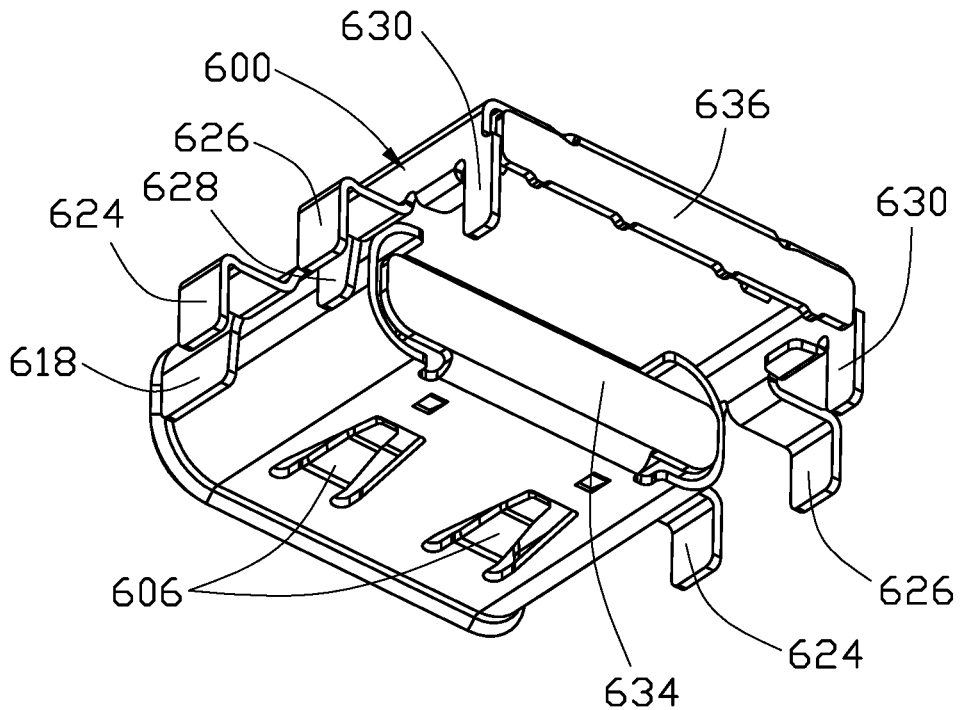
FIG. 41(B) is a rear perspective view of the receptacle connector of FIG. 41(A)
Figure 42:
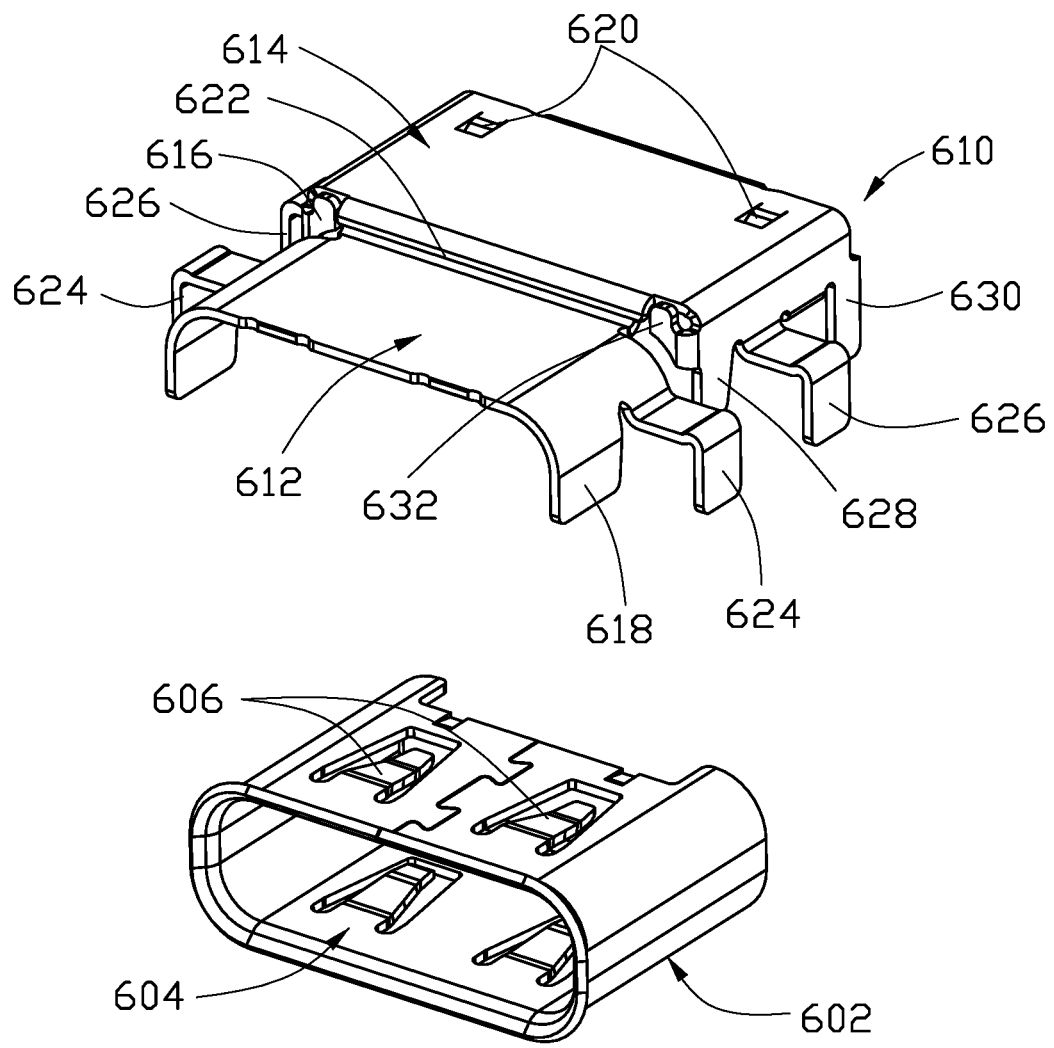
FIG. 42 is a front perspective view of the receptacle connector of FIG. 41(A)
Figure 43:
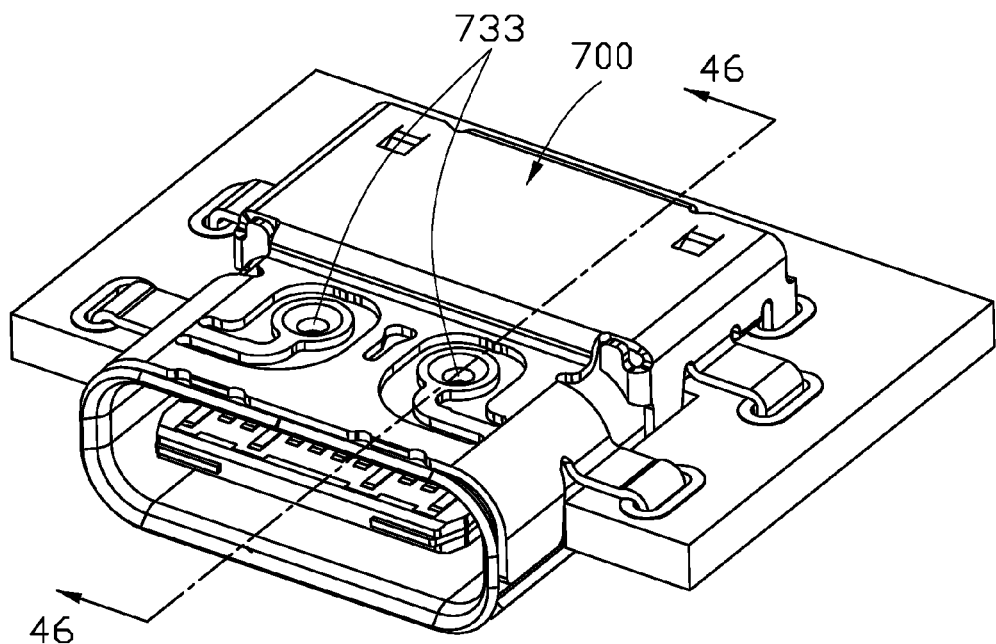
FIG. 43 is a front assembled perspective view of a fifth embodiment of the receptacle connector mounted upon a printed circuit board according to the invention.
Figure 44:
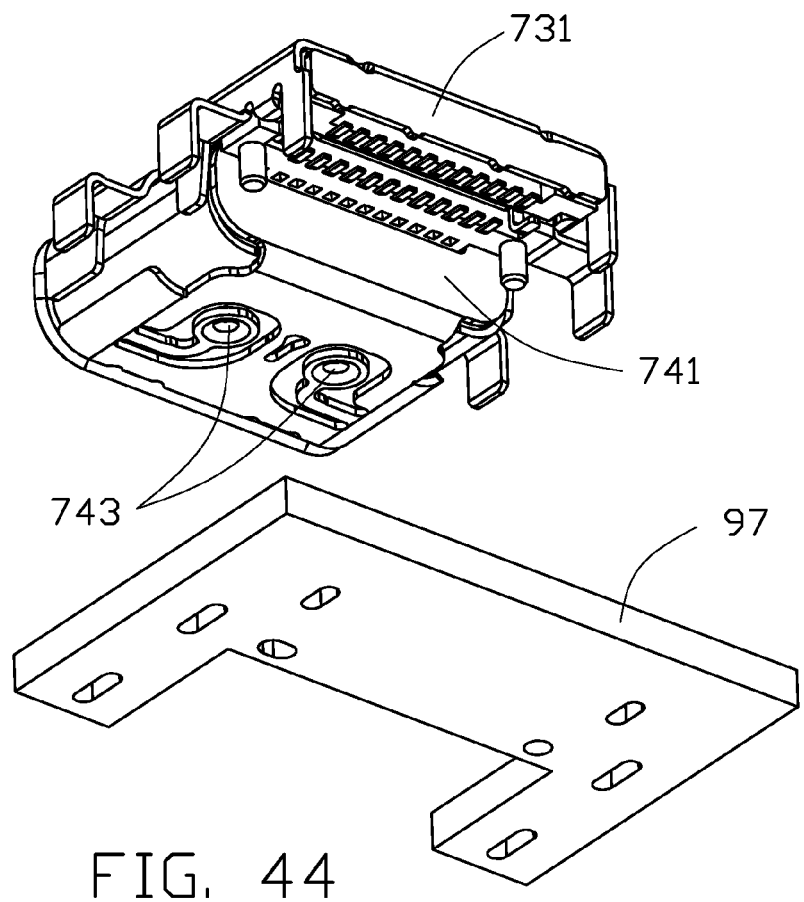
FIG. 44 is a rear exploded perspective view of the receptacle connector taken away from the printed circuit board of FIG. 43.
Figure 45:
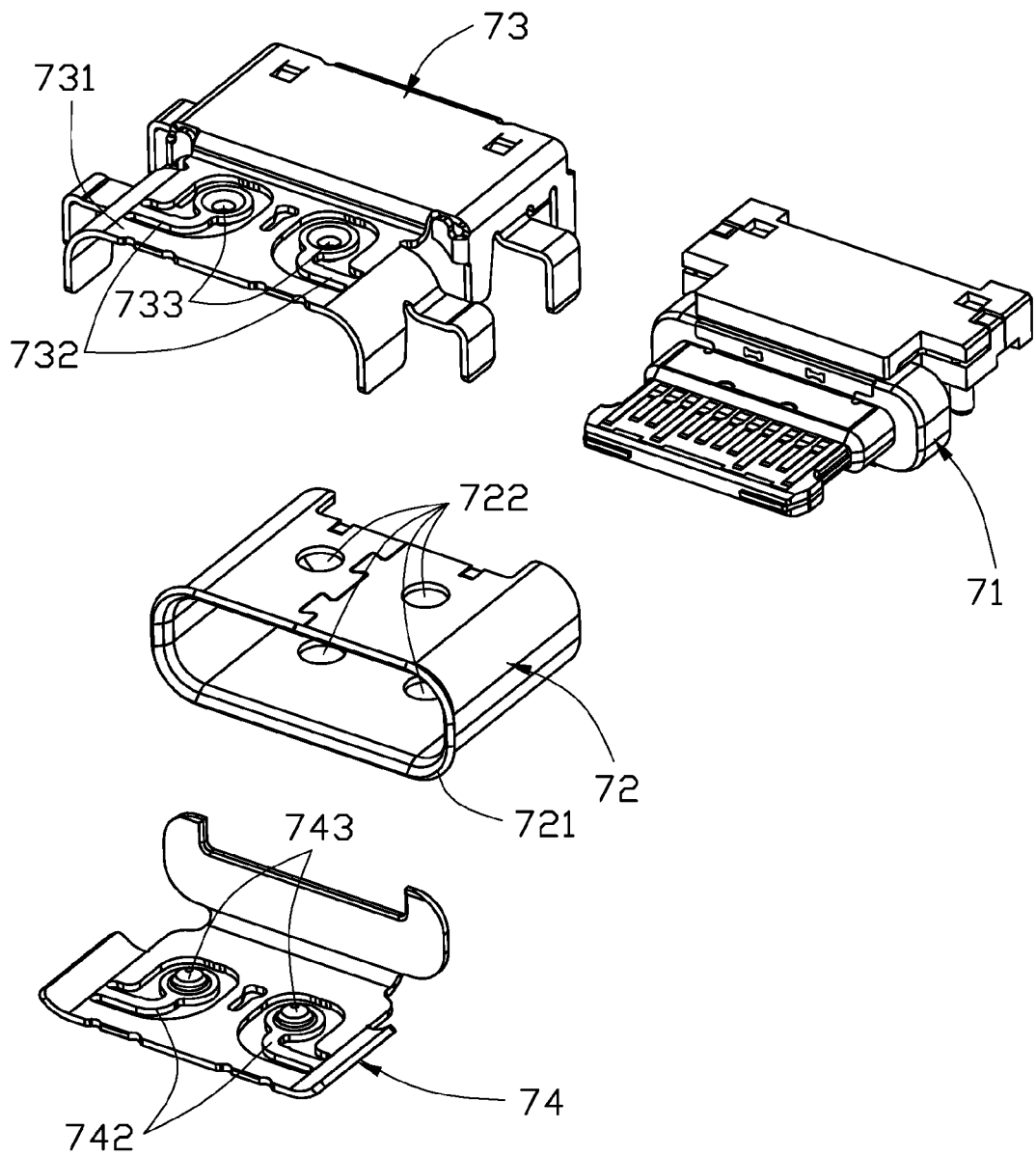
FIG. 45 is a further front exploded perspective view of the receptacle connector of FIG. 44.
Figure 46:
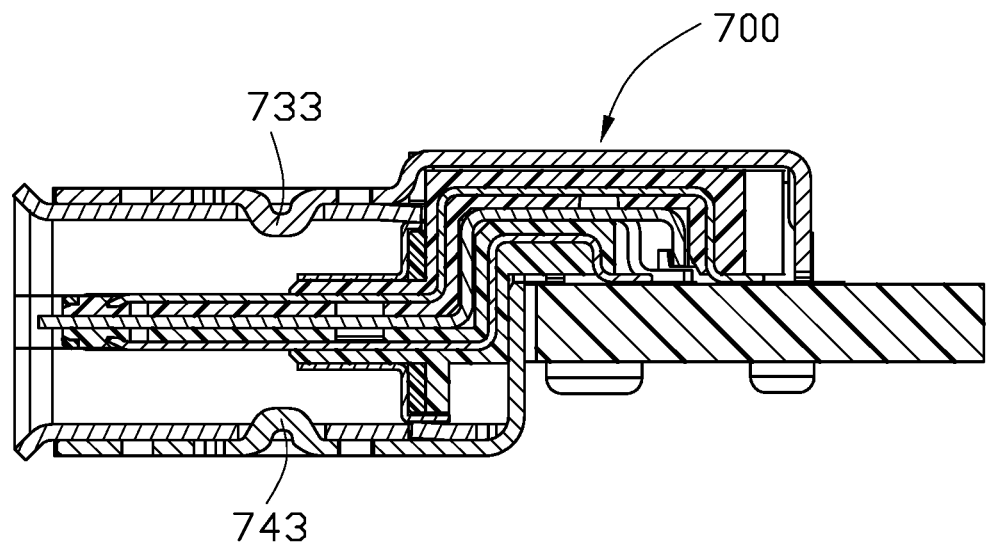
FIG. 46 is a cross-sectional view of the receptacle connector mounted on the printed circuit board taken along lines 46-46 in FIG. 43.

FIGS. 41(A)-42 show a fourth embodiment of the receptacle connector 600 mounted upon and within a notch of the printed circuit board (not shown) wherein the receptacle connector 600 includes a terminal module or an insulative housing (not shown, which is similar to the previous embodiments) enclosed within a metallic shield 602 which forms a capsular mating cavity or mating port 604 and is equipped with a plurality of spring tangs 606 extending into the mating cavity 604 for retaining the plug connector therein. Different from the first embodiment disclosing the shield 50 forming both the front capsular section and the rear partially rectangular section, the shield 602 in this embodiment essentially only forms the front capsular section for easing manufacturing consideration. On the other hand, the bracket 95 in the first embodiment is attached to the bottom side of the shield 50, while in this embodiment the metallic bracket 610 is secured to a top side of the shield 602 and forms not only the partially capsular front section 612 to compliantly cover the upper portion of the shield 602 but also the partially rectangular rear section 614 to compliantly cover the upstanding housing (not shown). To efficiently secure to the shield 602, the top wall 616 and the side walls 618 of the front section 612 of the bracket 610 is welded to the shield 602, and the rear section 614 forms securing tabs 620 for engagement within corresponding recesses in the top face of the housing (not shown). One feature of this embodiment is that the bracket 610 forms a curved or S-shaped cross-sectional joint section 622 between the front section 612 and the rear section 614 for compensating minor variations regarding the position of the shield 602 in the height direction which is expected to be little adjustable relative to the printed circuit board. Notably, the relative position of the mating port 604 with regard to the printed circuit board 650 may be different according to the computer maker so the adjustability of the mating port in the vertical direction is desired. To efficiently support the whole connector 600 within the notch and upon the printed circuit board, the front section 612 of the bracket 610 includes a pair of right angle legs 624, and the rear section 614 of the bracket 610 includes a pair of right angle legs 626 for mounting to the printed circuit board. The rear section 614 further includes a pair of securing arms 628 adjacent to the joint section 622 to be welded to the rear portion of the shield 610 for reinforcement of the whole connector structure around the joint section 622, and a pair of mounting legs 630 around the rear face to be mounted to the printed circuit board for reinforcing securing among the bracket 610, the printed circuit board and the housing (not shown) wherein the mounting legs 630 is closer to the securing tabs 620 which locks the housing (not shown). A pair of blocking tabs 632 are formed by two sides of the joint section 622 for preventing EMI invasion along the front-to-back direction. It is noted that the shield 602 has a rear wall 634 and the bracket has a rear wall 636 both for EMI protection along the front-to-back direction similar to the blocking tabs 632. Understandably, both the rear walls 634, 636 may be secured to the corresponding side walls via a pair of locking ears as shown in the previous embodiments. Understandably, the securing between the shield 602 and the bracket 610 via welding may be replaced with the mechanical latching tabs or similar mechanical means.

Referring to FIGS. 43-46 showing a receptacle connector 700 of a fifth embodiment of this invention, the receptacle connector 700 mounted upon and within the notch of the printed circuit board 97, includes a terminal module 71 essentially composed of an upper part and a lower part commonly sandwiching a shielding plate therebetween and further integrated together with a middle insulator. A metallic shield 72 is attached to the front portion of the terminal module 81 to enclose the mating tongue to form a mating cavity wherein a continuously uninterrupted flared flange 721 is formed at the front edge of the shield 72 in front of the mating cavity and a plurality of through holes 722 are formed in the shield 72. The upper metallic bracket 73 is attached on an upper side of the shield 72 and the lower metallic bracket 74 is attached on a lower side of the shield 72. The upper bracket 73 includes an upper rear wall 731 to shield the upper rear upper portion of the terminal module 81 and the lower bracket 73 includes a lower rear wall 741 to shield the lower rear portion of the terminal module 71. The upper bracket 73 further includes a plurality of spring arms 732 with the engaging tips 733 extending through the corresponding through holes 722 into the mating cavity for engagement with the plug connector. Similarly, the lower bracket 74 further includes a plurality of spring arms 742 with the engaging tips 743 extending through the corresponding through holes 722 into the mating cavity for engagement with the plug connector. The feature of this embodiment is to provide the continuously uninterrupted flared flange on the front edge of the shield 72 not only to protectively hide the front edges of the upper bracket 73 and the lower bracket 74 but also provide superior shielding effect circumferentially, compared with the interrupted flared flange disclosed in the prior art.

Figure 47:
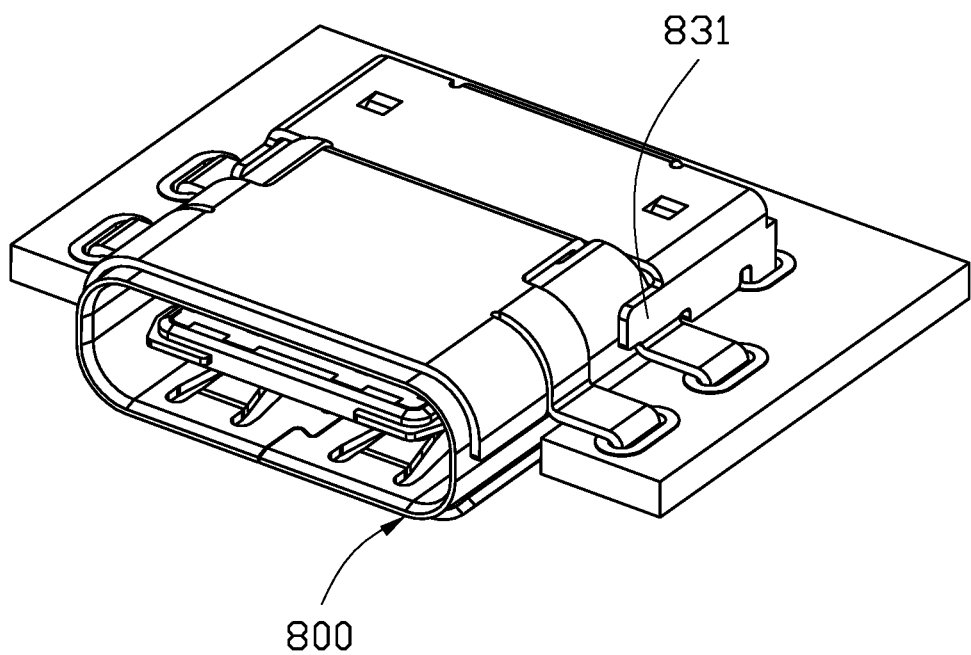
FIG. 47 is a front perspective view of a sixth embodiment of the receptacle connector mounted upon a printed circuit board according to the invention.
Figure 48:
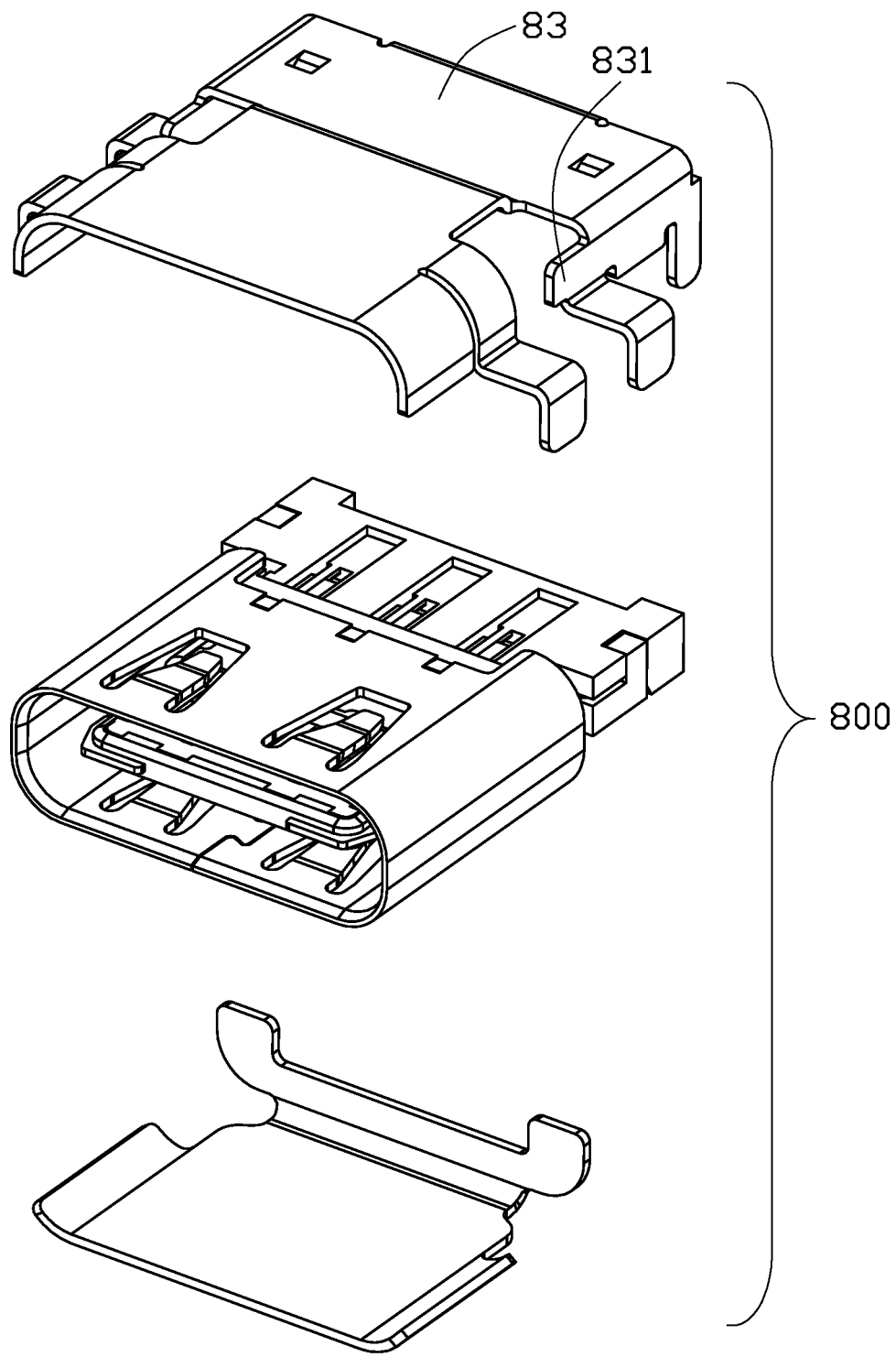
FIG. 48 is a front perspective view of the receptacle connector of FIG. 47.
Figure 49:
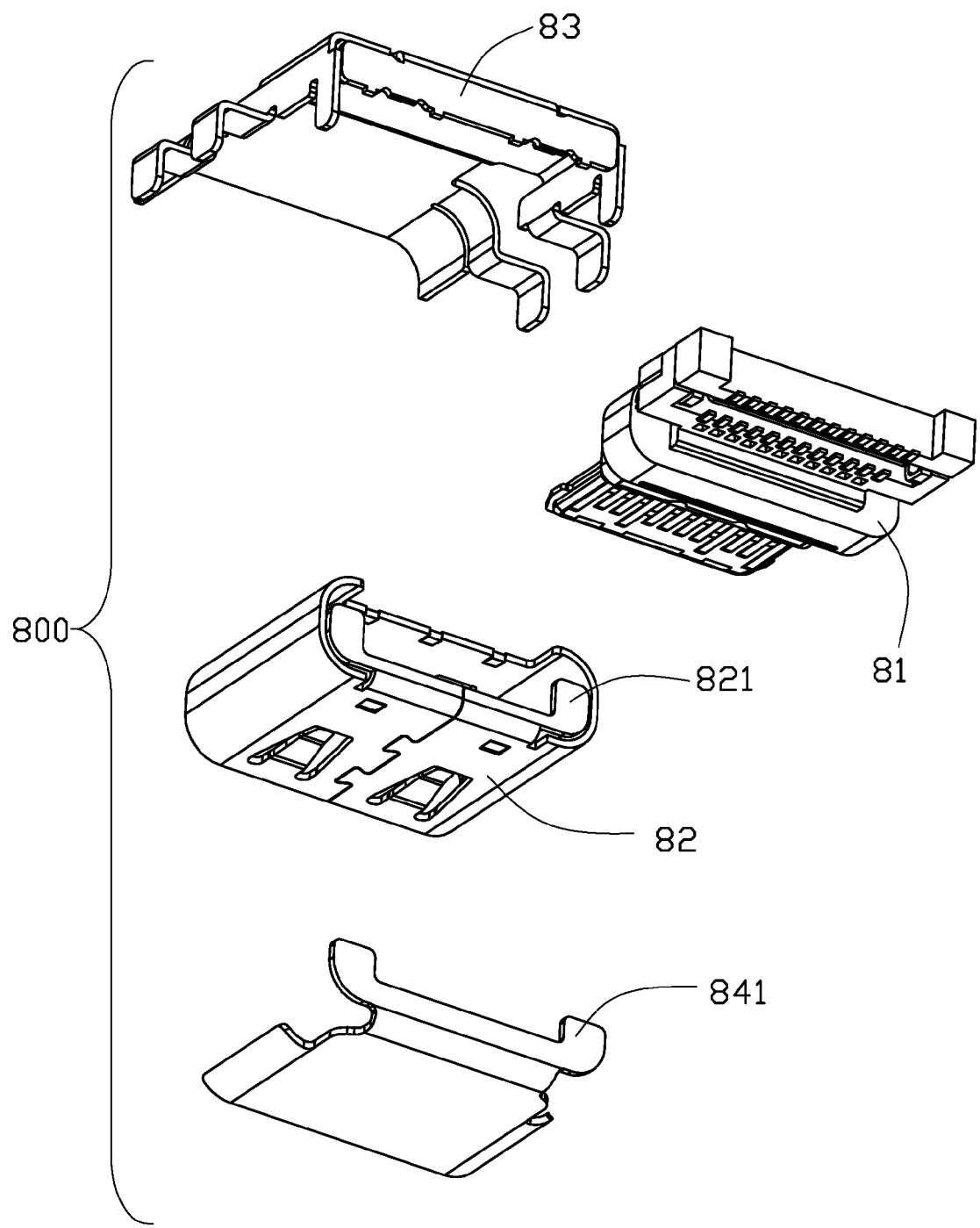
FIG. 49 is a rear assembled perspective view of the receptacle connector of FIG. 48.

Referring to FIGS. 47-49 showing a sixth embodiment of this invention. The receptacle connector 800 includes a terminal module 81 enclosed in the metallic shield 82 and further is equipped with the upper metallic bracket 83 and the lower metallic bracket 84 so as to efficiently shield the whole connector 800 in the three dimensional way for full EMI protection. Notably, in this embodiment, the receptacle connector 800 is mounted within a notch of the small PCB in a sinking type for performing a lower profile configuration. The shield 82 and lower bracket 83 further define rear walls 821, 841 which two engage with the rear side of the terminal module 81 to achieve a full EMI protection. The upper bracket 83 further defines a pair of front tabs 831 extending forwards from two opposite corners of a rear part thereof to press against the shield 82.

Figure 50:
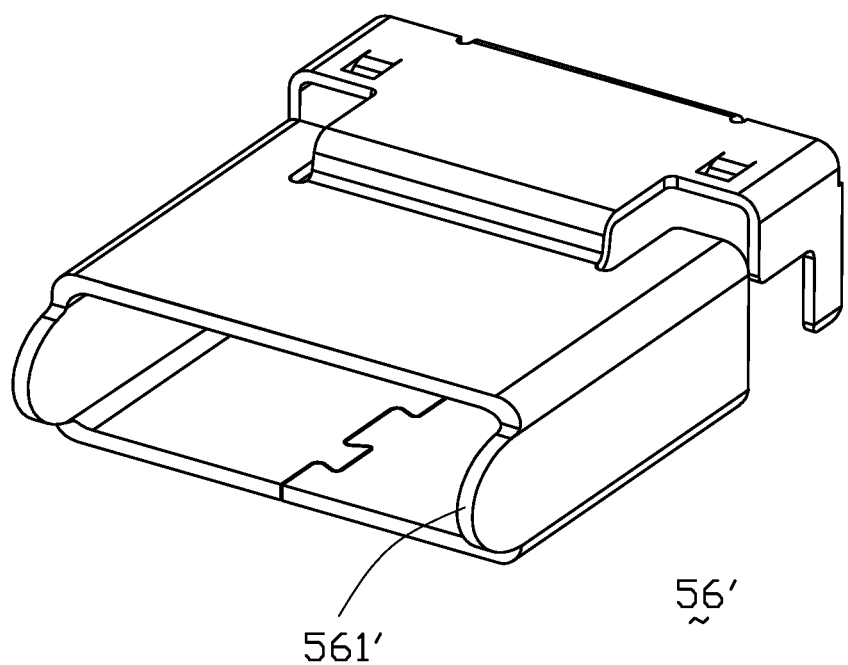
FIG. 50 is a perspective view of a metallic shell of the receptacle connector according to another embodiment.

Referring to FIG. 50, according to another embodiment similar to the first embodiment, to comply with the contour of the case in which the flippable receptacle connector is retained, the front edge of the metallic shield 56' may be no longer a straight line extending along a vertical direction but a curved structure 561', in a side view, with at least one rearwardly recessed portion on either the upper or lower side. Anyhow, the distance measured from the outermost point of the curved front edge structure may be still same as that of the original one disclosed in the first embodiment without such the rearwardly recessed portion.

Figure 51:
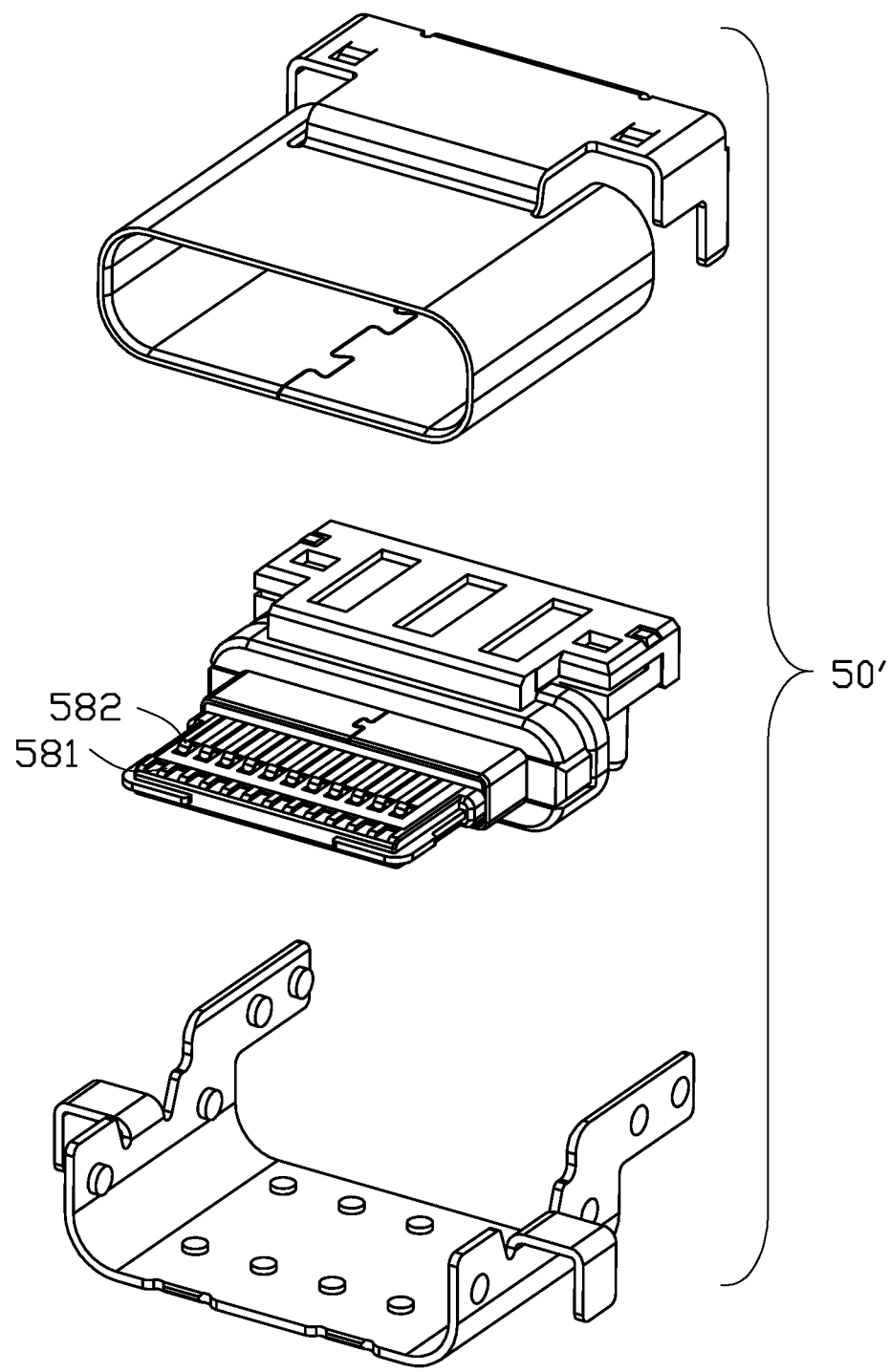
FIG. 51 is a perspective view of the receptacle connector according to another embodiment.

FIG. 51 shows another embodiment of the flippable receptacle connector 50' wherein the contacts on each face of the mating tongue include a plurality of stationary contacts 581 in the front row and a plurality of deflectable contacts 582 in the rear row. The detailed structure may be referred to U.S. Pat. No. 7,614,887.

However, the disclosure is illustrative only, changes may be made in detail, especially in matter of shape, size, and arrangement of parts within the principles of the invention.

What is claimed is:

1. A receptacle connector for mounting to a printed circuit board, comprising:

an insulative housing defining a base with a mating tongue extending therefrom, the mating tongue defining a thicken step portion around a root thereof adjacent to the base;
a metallic shield retained around the base and surrounding the mating tongue so as to define a mating cavity between the metallic shied and the mating tongue, the metallic shield including a first wall, a second wall opposite to the first wall and two opposite end walls integrally connecting with the first and second walls;
two rows of contacts disposed in the insulating housing with contacting sections exposed upon the mating tongue and mounting tails out of the base, the mating cavity and the contacts being arranged in a diagonally symmetrical arrangement;
a pair of metallic locking notches protruding beyond corresponding lateral sides of the mating tongue for locking with a pair of internal latch of a plug connector;
a metallic bracket attached to a front portion of the first wall of the metallic shield and having mounting pads;
wherein the first wall of the metallic shield defines a pair of spring tangs split therefrom and extending rearwards into the mating cavity, the second wall defines a pair of dimples protruding inwards the mating cavity without any openings for holding the plug connector, the metallic bracket covers spring tangs and seals any opens defined on the first wall for keeping integrity therewith under EMI consideration;
the receptacle connector further comprising a metallic plate embedded in the insulating housing, wherein the metallic locking notches is defines on the metallic plate, the metallic plate comprises a front horizontal portion in the mating tongue and the base and a rear vertical portion extending out of the base and between two rows of the mounting tails of the contacts;
wherein the metallic plate further comprising a pair contacting regions formed of plates unitarily folded respectively from two opposite lateral ends of the shielding plate and exposed upon the step portion; and
wherein each of the pair of the contacting regions is equipped with a lance at a tip to be secured to the shielding plate.

2. The receptacle connector as claimed in claim 1, wherein the end walls defines spring tangs split therefrom and extend rearwards into the mating cavity, and the metallic bracket includes a pair of endwalls covering the spring tangs and sealing corresponding opens on the endwalls.

3. The receptacle connector as claimed in claim 1, wherein the metallic bracket defines mounting tails extending from the endwalls thereof for mounting to the printed circuit board.

4. The receptacle connector as claimed in claim 1, wherein the metallic shield defines mounting tails extending from rear sides of the end walls thereof.

5. The receptacle connector as claimed in claim 1, wherein the metallic shield further includes a rear wall with two ears latched to two opposite end walls of the shield.

6. The receptacle connector as claimed in claim 1, wherein the rear wall of the metallic shield further defines mounting tails.

7. The receptacle connector as claimed in claim 1, wherein a front edge of the metallic shield is equipped with a plurality of flared flanges for easy insertion of the plug connector.

8. The receptacle connector as claimed in claim 1, wherein a front edge of the metallic shield is equipped with a plurality of flared flanges for easy insertion of the plug connector.

9. The receptacle connector as claimed in claim 1, wherein the shielding plate comprises a first shielding plate located between the mating tongue and the base and a second shielding portion bending from the first shielding portion and located between the tails of the two row of the contacts.

10. The receptacle connector as claimed in claim 1, wherein the shielding plate further defines a spring arms laterally and horizontally going through two lateral sides of the base.

* * * * *